US012575100B2

(12) United States Patent
Sondhi et al.

(10) Patent No.: US 12,575,100 B2
(45) Date of Patent: Mar. 10, 2026

(54) THREE-DIMENSIONAL MEMORY DEVICE INCLUDING DISCRETE CHARGE STORAGE ELEMENTS AND METHOD OF MAKING THEREOF

(71) Applicant: SANDISK TECHNOLOGIES LLC, Addison, TX (US)

(72) Inventors: Kartik Sondhi, Milpitas, CA (US); Adarsh Rajashekhar, Santa Clara, CA (US); Rahul Sharangpani, Fremont, CA (US); Raghuveer S. Makala, Campbell, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 650 days.

(21) Appl. No.: 17/659,902

(22) Filed: Apr. 20, 2022

(65) Prior Publication Data

US 2023/0345719 A1 Oct. 26, 2023

(51) Int. Cl.
H10B 43/27 (2023.01)
H10B 41/27 (2023.01)
(52) U.S. Cl.
CPC ............. H10B 43/27 (2023.02); H10B 41/27 (2023.02)
(58) Field of Classification Search
CPC .................. G11C 5/06; G11C 16/0483; G11C 2211/5641; G11C 11/5628; G11C 11/5642; G11C 16/06; G11C 16/10; H01L 23/315; H01L 23/485; H01L 29/40114; H01L 29/40117; H10B 43/10; H10B 41/27; H10B 41/35; H10B 43/35; H10B 43/27; H10B 41/10; H10B 43/50; H10B 43/40; H10D 30/683; H10D 64/035; H10D 30/69; H10D 64/037; H10D 64/685; H10D 64/691; H10D 30/693; H10D 30/689; H10D 30/0411
See application file for complete search history.

(56) References Cited

U.S. PATENT DOCUMENTS

| | | | |
|---|---|---|---|
| 9,252,151 | B2 | 2/2016 | Chien et al. |
| 9,356,031 | B2 | 5/2016 | Lee et al. |
| 9,397,093 | B2 | 7/2016 | Makala et al. |
| 9,419,012 | B1 | 8/2016 | Shimabukuro et al. |

(Continued)

OTHER PUBLICATIONS

Acker, J. et al., "HF/HNO3 etching of the saw damage." *Energy Procedia*, vol. 38 (2013): pp. 223-233.

(Continued)

*Primary Examiner* — Jessica S Manno
*Assistant Examiner* — Victor Joseph Lasasso
(74) *Attorney, Agent, or Firm* — THE MARBURY LAW GROUP PLLC

(57) ABSTRACT

An alternating stack of insulating layers and electrically conductive layers is formed over a substrate, and a memory opening vertically extends through the alternating stack. The memory opening is laterally expanded at levels of the insulating layers. At least one blocking dielectric layer is formed in the memory opening. A first vertical stack of discrete charge storage elements is formed at levels of the electrically conductive layers. A second vertical stack of discrete dielectric material portions is formed at the levels of the insulating layers. A tunneling dielectric layer is formed over the first vertical stack and the second vertical stack. A vertical semiconductor channel is formed on the tunneling dielectric layer.

20 Claims, 27 Drawing Sheets

(56) References Cited

U.S. PATENT DOCUMENTS

| | | | |
|---|---|---|---|
| 9,449,981 B2 | 9/2016 | Pachamuthu et al. | |
| 9,478,495 B1 | 10/2016 | Pachamuthu et al. | |
| 9,576,975 B2 | 2/2017 | Zhang et al. | |
| 9,627,395 B2 | 4/2017 | Zhan et al. | |
| 9,659,955 B1 | 5/2017 | Sharangpani et al. | |
| 9,875,929 B1 | 1/2018 | Shukla et al. | |
| 9,960,180 B1 | 5/2018 | Zhou et al. | |
| 9,991,277 B1 | 6/2018 | Tsutsumi et al. | |
| 10,373,969 B2 | 8/2019 | Zhang et al. | |
| 10,516,025 B1 | 12/2019 | Nishikawa et al. | |
| 10,763,271 B2 | 9/2020 | Rabkin et al. | |
| 10,998,331 B2 | 5/2021 | Zhou et al. | |
| 11,049,807 B2 | 6/2021 | Li et al. | |
| 11,101,289 B1 | 8/2021 | Ueda et al. | |
| 11,114,462 B1 | 9/2021 | Cui et al. | |
| 11,164,883 B2 | 11/2021 | Rabkin et al. | |
| 11,244,953 B2 | 2/2022 | Kanakamedala et al. | |
| 2007/0029607 A1 | 2/2007 | Kouznetzov | |
| 2010/0163968 A1* | 7/2010 | Kim | H10B 43/27 257/E21.423 |
| 2011/0205796 A1* | 8/2011 | Kim | H10B 43/27 365/185.17 |
| 2012/0001249 A1 | 1/2012 | Alsmeier et al. | |
| 2014/0008714 A1* | 1/2014 | Makala | H10B 41/20 257/E27.06 |
| 2014/0225181 A1 | 8/2014 | Makala et al. | |
| 2015/0008505 A1 | 1/2015 | Chien et al. | |
| 2016/0035742 A1* | 2/2016 | Kanakamedala | H10D 64/035 438/264 |
| 2016/0043093 A1 | 2/2016 | Lee et al. | |
| 2016/0086972 A1 | 3/2016 | Zhang et al. | |
| 2017/0125436 A1 | 5/2017 | Sharangpani et al. | |
| 2018/0151588 A1 | 5/2018 | Tsutsumi et al. | |
| 2019/0214395 A1 | 7/2019 | Zhang et al. | |
| 2019/0252405 A1 | 8/2019 | Tsutsumi | |
| 2019/0386108 A1 | 12/2019 | Nishikawa et al. | |
| 2020/0006364 A1 | 1/2020 | Rabkin et al. | |
| 2020/0006374 A1 | 1/2020 | Rabkin et al. | |
| 2020/0006375 A1 | 1/2020 | Zhou et al. | |
| 2020/0127002 A1* | 4/2020 | Park | H10B 43/27 |
| 2021/0057435 A1* | 2/2021 | Surthi | H10D 64/037 |
| 2021/0265372 A1 | 8/2021 | Kanakamedala et al. | |
| 2021/0265385 A1 | 8/2021 | Rajashekhar et al. | |
| 2021/0327889 A1 | 10/2021 | Makala et al. | |
| 2021/0327890 A1 | 10/2021 | Makala et al. | |
| 2021/0327897 A1 | 10/2021 | Kasai et al. | |
| 2021/0408031 A1 | 12/2021 | Sharangpani et al. | |
| 2022/0045089 A1 | 2/2022 | Mizutani et al. | |
| 2022/0093644 A1 | 3/2022 | Sharangpani et al. | |

OTHER PUBLICATIONS

Bhaskaran, M. et al., "Characterisation of Nickel Silicide Thin Films by Spectroscopy and Microscopy Techniques," Science Direct, Micron, vol. 40, pp. 99-103 (2009).

Chen, W.R. et al., "Formation and nonvolatile memory characteristics of multilayer nickel-silicide NCs embedded in nitride layer." *Journal of Applied Physics*, vol. 104.9 (2008):094303.

Chen, W.R., et al., "Formation of stacked nickel-silicide nanocrystals by using a co-mixed target for nonvolatile memory application." Surface and Coatings Technology, vol. 202.4-7 (2007): pp. 1292-1296.

Endoh et al., "Novel Ultra High-Density Memory with a Stacked-Surrounding Gate Transistor (S-SGT) Structured Cell," IEDM Proc. (2001) 33-36.

Fujifilm, "Freckle Etch," Technical Product Information, (2020).

Hayafuji, Y., et al., "Nitridation of Silicon and Oxidized-Silicon." *Journal of the Electrochemical Society* 129.9 (1982): 2102.

Jang, Y.S. et al., "Charge Storage Properties of Nickel Silicide Nanocrystal Layer Embedded in Silicon Dioxide." *MRS Online Proceedings Library (OPL)*, No. 1160 (2009).

https://about.kioxia.com/en-jp/rd/technology-topics/topics-12.html visited Apr. 20, 2022.

Liu, G. et al., "Selective area crystallization of amorphous silicon films by low-temperature rapid thermal annealing." Citation: Applied Physics Letters, vol. 55, No. 660 (1989); View online: http://dx. doi.org/10.1063/1.101814.

Murdzek, J.A., et al., "Thermal Atomic Layer Etching of Nickel Using Sequential Chlorination and Ligand-Addition Reactions." *Chem. Mater.* 2021, vol. 33, No. 23, pp. 9174-9183. https://doi.org/10.1021/acs.chemmater.1c02684.

Qin, M. et al., "A study of nickel silicide film as a mechanical material." *Sensors and Actuators A: Physical*, vol. 87.1-2 (2000): pp. 90-95.

Radjenović, B. et al., "Level set approach to anisotropic wet etching of silicon." *Sensors*, vol. 10.5 (2010): 4950-4967.

Scholz, M., et al., "Silver-induced layer exchange for the low-temperature preparation of intrinsic polycrystalline silicon films." *Applied Physics Letters*, vol. 94.1 (2009): 012108.

Seol, K.S., et al. "A new floating gate cell structure with a silicon-nitride cap layer for sub-20 nm NAND flash memory." *2010 Symposium on VLSI Technology*. IEEE, 2010.

Van Gestel, D., et al., "Metal induced crystallization of amorphous silicon for photovoltaic solar cells," Physics Procedia, vol. 11, 2011, pp. 196-199, ISSN 1875-3892, https://doi.org/10.1016/.phpro.2011. 01.003.

Wu, C.L., et al., "N2-plasma nitridation on Si (111): Its effect on crystalline silicon nitride growth." *Surface science*, vol. 606, pp. 15-16 (2012): L51-L54.

U.S. Appl. No. 17/082,629, filed Oct. 28, 2020, SanDisk Technologies LLC.

U.S. Appl. No. 17/169,987, filed Feb. 8, 2021, SanDisk Technologies LLC.

U.S. Appl. No. 17/189,153, filed Mar. 1, 2021, SanDisk Technologies LLC.

U.S. Appl. No. 17/192,462, filed Mar. 4, 2021, SanDisk Technologies LLC.

U.S. Appl. No. 17/679,335, filed Feb. 24, 2022, SanDisk Technologies LLC.

* cited by examiner

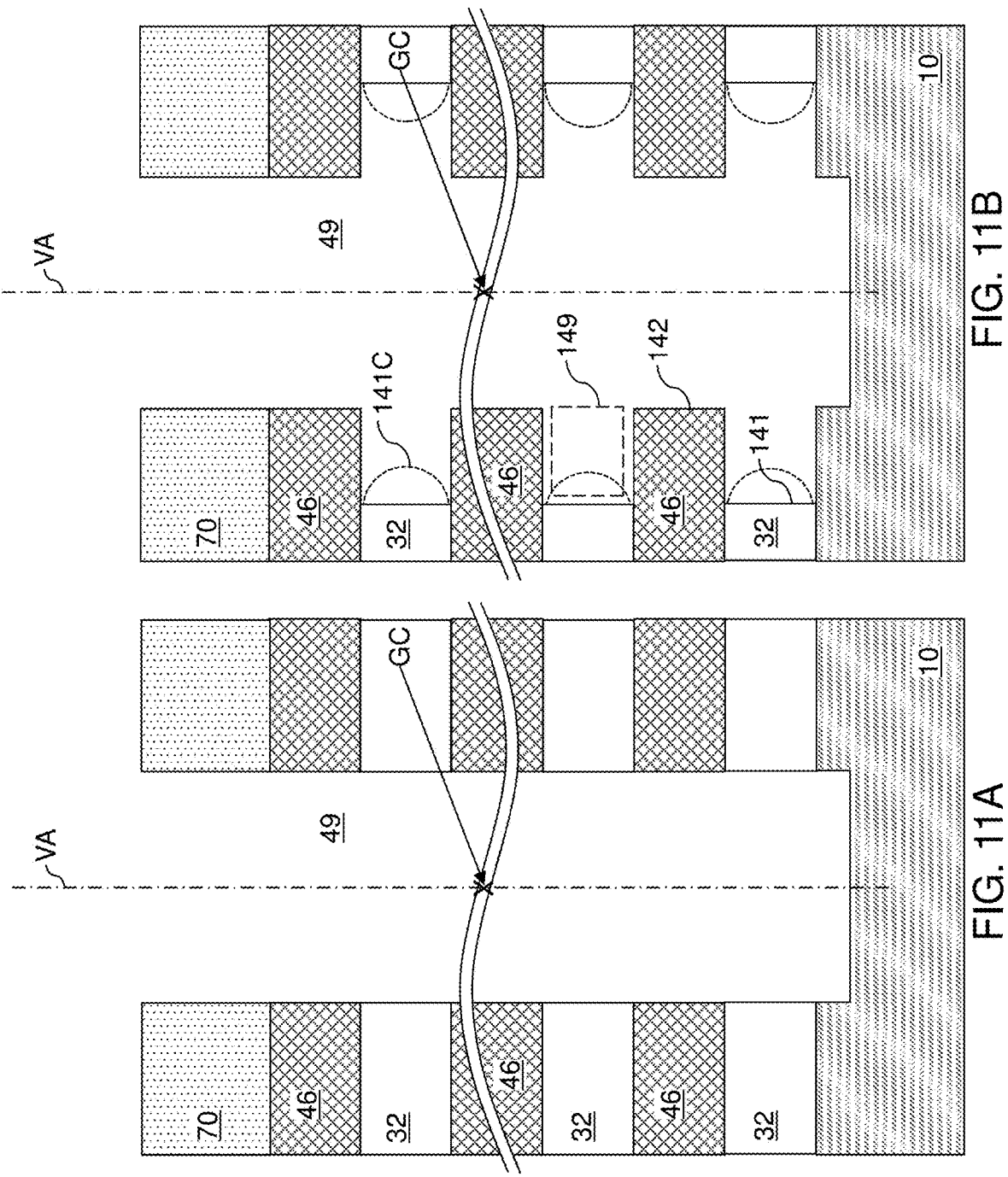

THREE-DIMENSIONAL MEMORY DEVICE INCLUDING DISCRETE CHARGE STORAGE ELEMENTS AND METHOD OF MAKING THEREOF

FIELD

The present disclosure relates generally to the field of semiconductor devices, and particularly to a three-dimensional memory device including discrete charge storage elements and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers; a memory opening vertically extending through the alternating stack; and a memory opening fill structure located within the memory opening and comprising: a first vertical stack of discrete charge storage elements located at levels of the electrically conductive layers and vertically spaced from each other; a second vertical stack of discrete dielectric material portions located at levels of the insulating layers and vertically spaced from each other; a tunneling dielectric layer in contact with the first vertical stack and the second vertical stack; and a vertical semiconductor channel in contact with the tunneling dielectric layer.

According to another aspect of the present disclosure, a method of forming a semiconductor structure is provided, which comprises: forming an alternating stack of insulating layers and electrically conductive layers over a substrate, wherein a memory opening vertically extends through the alternating stack; laterally expanding the memory opening at levels of the insulating layers by laterally recessing sidewalls of the insulating layers around the memory opening relative to sidewalls of the electrically conductive layers around the memory opening; forming at least one blocking dielectric layer on the insulating layers and the electrically conductive layers around the memory opening; forming a first vertical stack of discrete charge storage elements at levels of the electrically conductive layers; forming a second vertical stack of discrete dielectric material portions at the levels of the insulating layers; forming a tunneling dielectric layer over the first vertical stack and the second vertical stack; and forming a vertical semiconductor channel on the tunneling dielectric layer.

DETAILED DESCRIPTION

Figure 1:
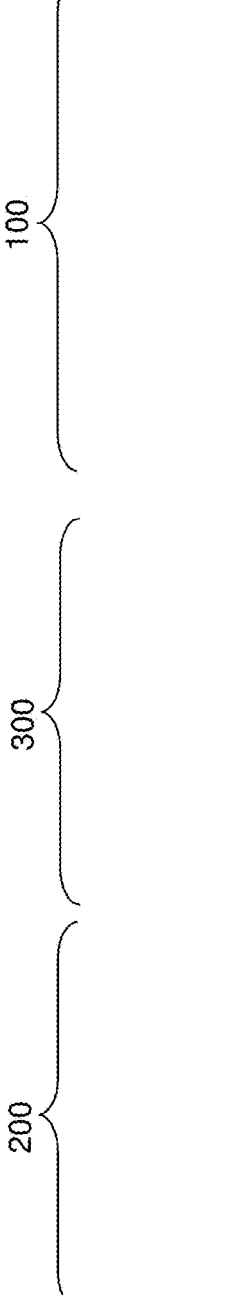
FIG. 1 is a schematic vertical cross-sectional view of an exemplary structure after formation of at least one peripheral device, a semiconductor material layer, and a gate dielectric layer according to an embodiment of the present disclosure.
Figure 1:
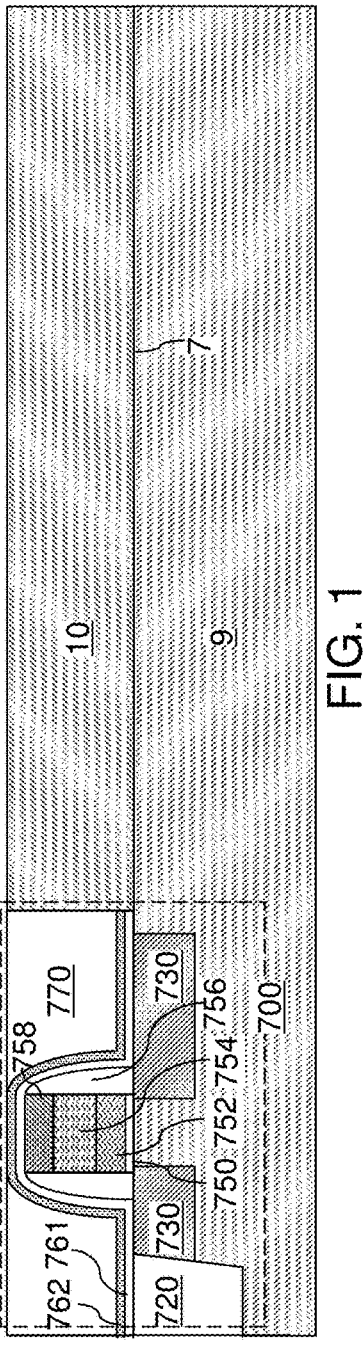

As discussed above, the present disclosure is directed to a three-dimensional memory device including discrete charge storage elements and methods of manufacturing the same, the various aspects of which are described below. The discrete charge storage elements reduce leakage current between vertically neighboring memory cells. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
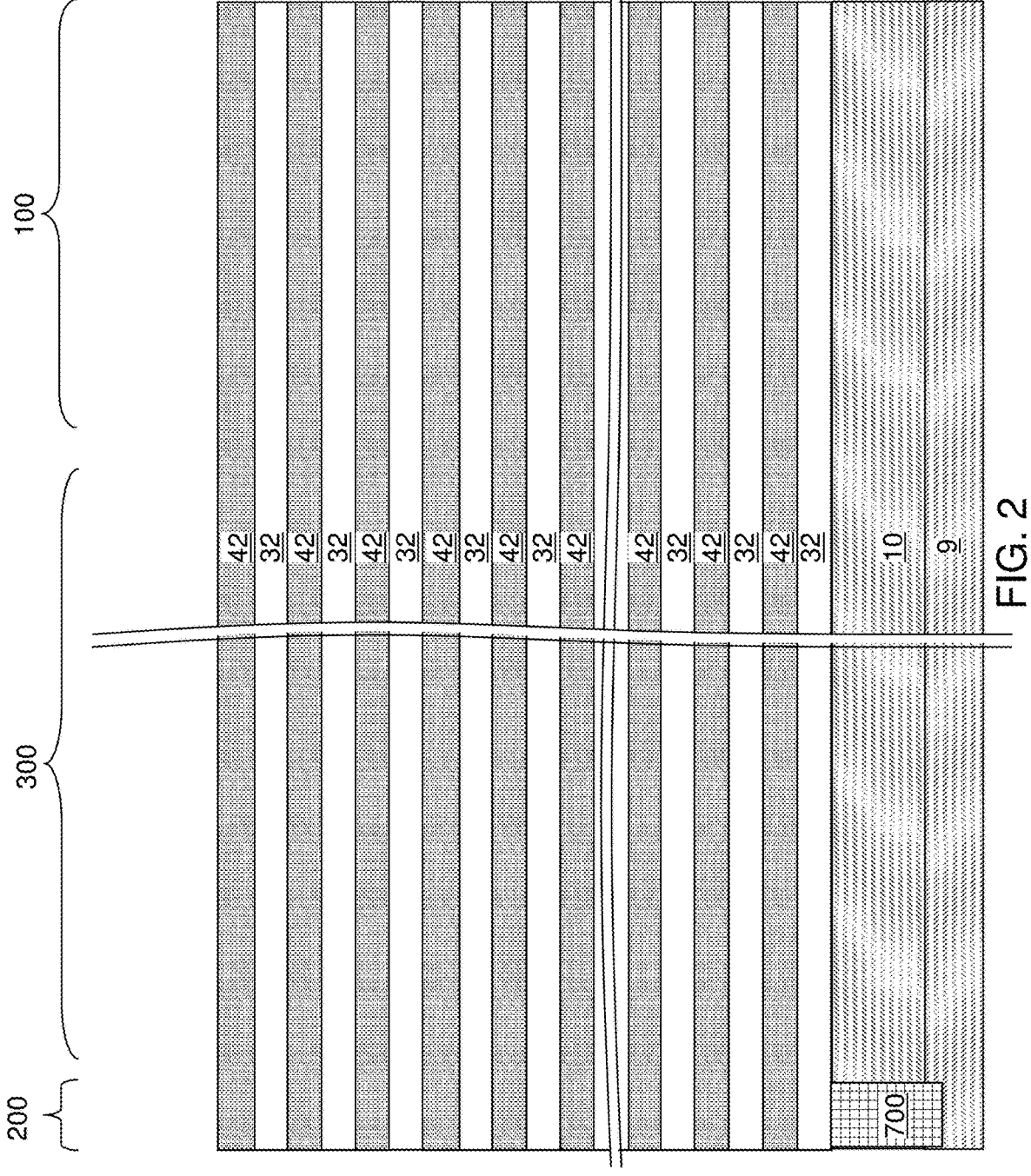
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes an in-process alternating stack of insulating layers 32 and sacrificial material layers 42. As used herein, a "prototype" structure or an "in-process" structure refers to a transient structure that is subsequently modified in the shape or composition of at least one component therein.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42. In one embodiment, the topmost layer of the alternating stack (32, 42) may be a sacrificial material layer 42, which is herein referred to as a topmost sacrificial material layer.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Figure 3:
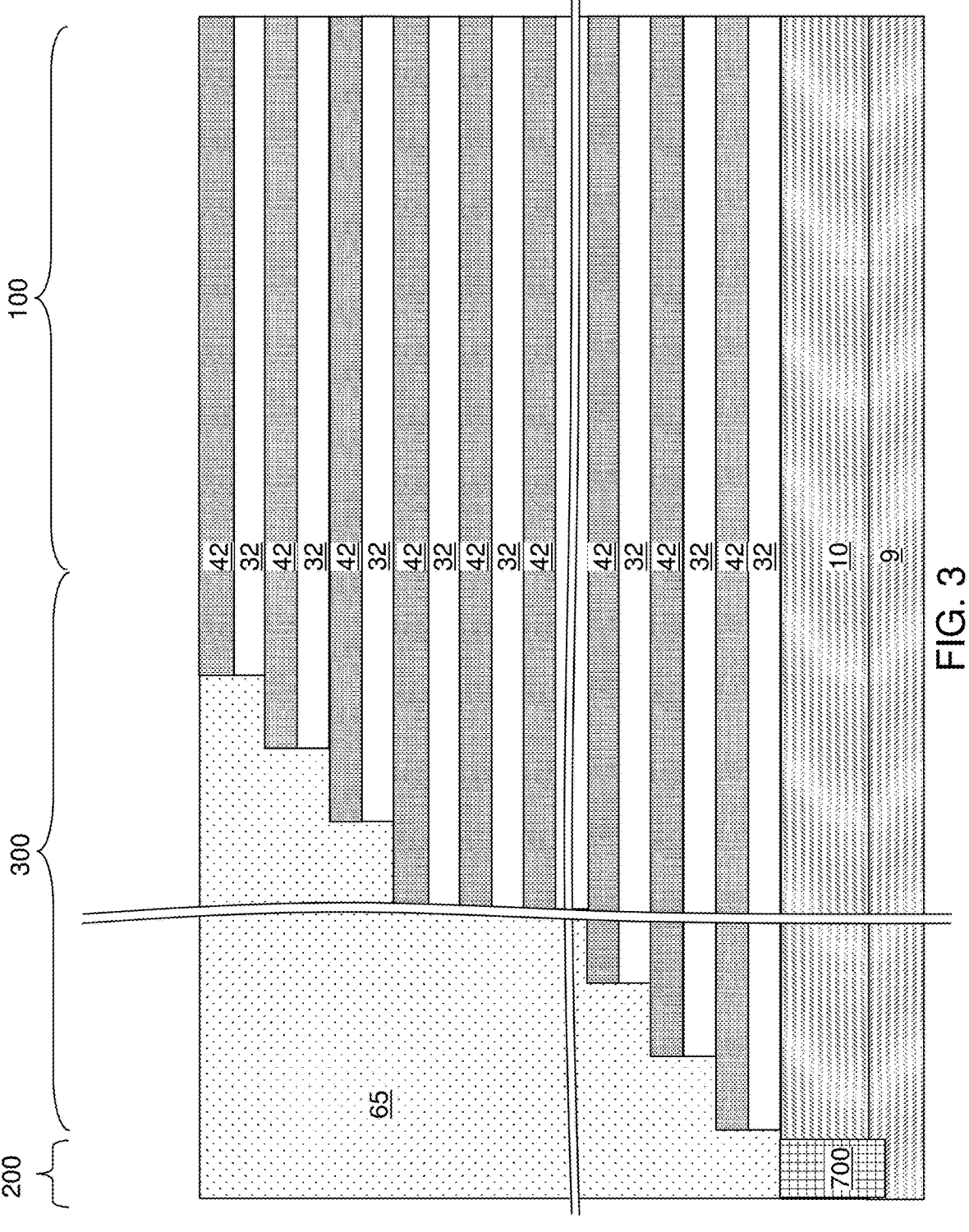
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
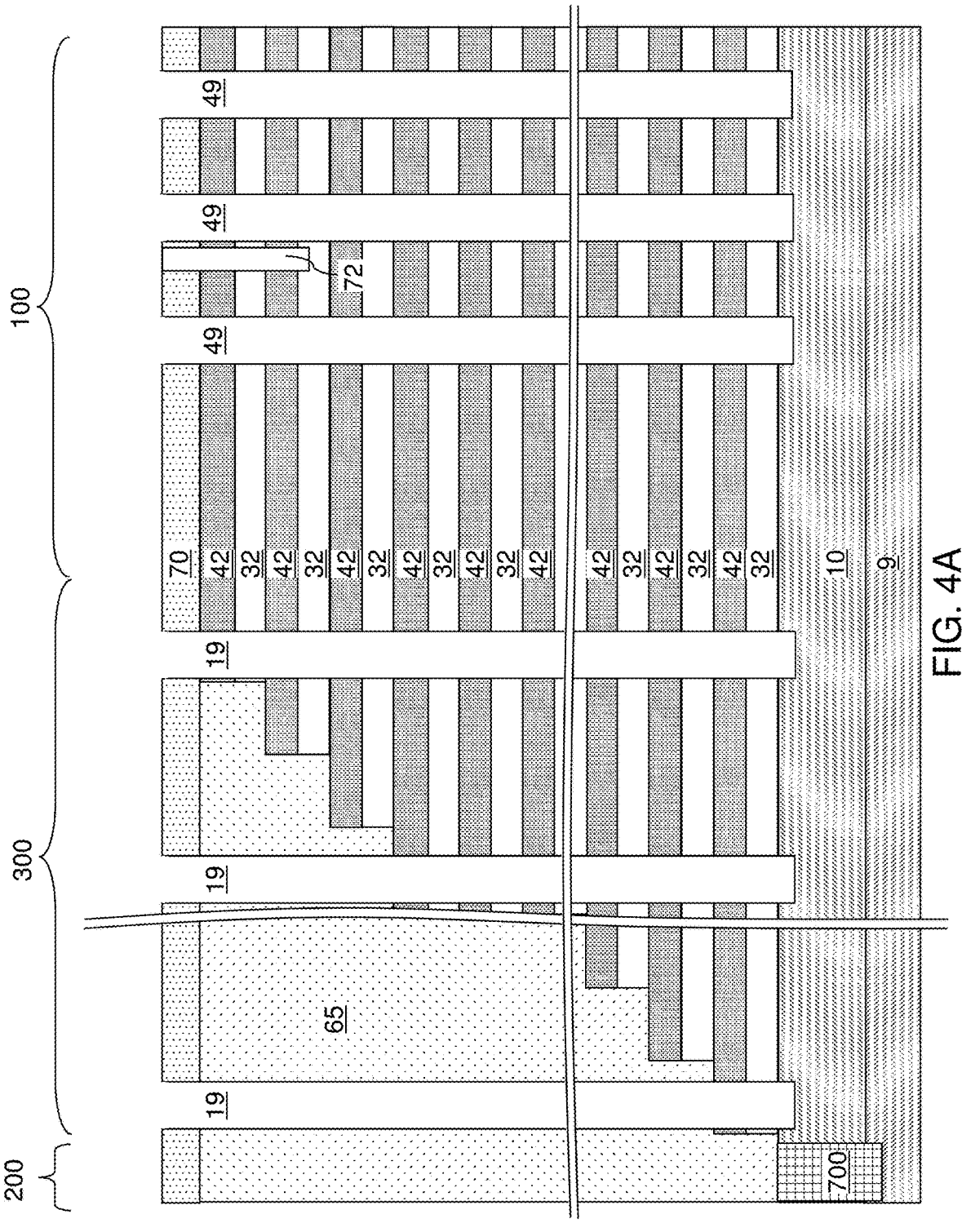
FIG. 4A is a schematic vertical cross-sectional view of the exemplary structure after formation of a capping dielectric layer, drain-select-level isolation structures, memory openings, and support openings according to an embodiment of the present disclosure.
Figure 4B:
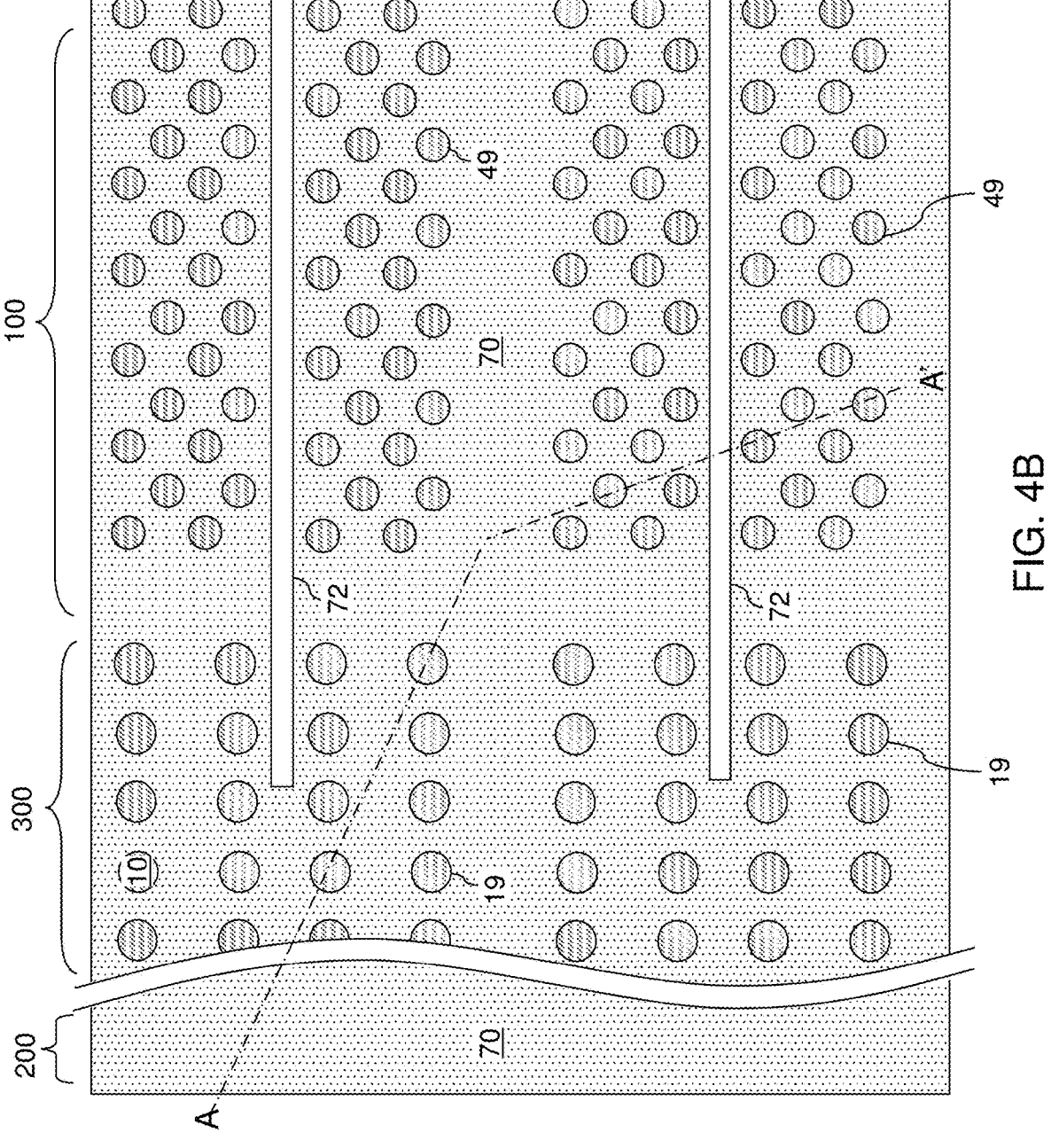
FIG. 4B is a top-down view of the exemplary structure of FIG. 4A. The vertical plane A-A' is the plane of the cross-section for FIG. 4A.

Referring to FIGS. 4A and 4B, a capping dielectric layer 70 can be formed over the alternating stack (32, 42) and the retro-stepped dielectric material portion 65. According to an aspect of the present disclosure, the capping dielectric layer 70 comprises a dielectric material that is different from the materials of the insulating layers 32 and the sacrificial material layers 42. For example, if the insulating layers 32 comprises silicon oxide and if the sacrificial material layers 42 comprise silicon nitride, the capping dielectric layer 70 may comprise silicon carbide nitride, silicon oxynitride, a dielectric metal oxide, or a combination thereof. The thickness of the capping dielectric layer 70 may be in a range from 10 nm to 100 nm, although lesser and greater thicknesses may also be employed.

Optionally, drain-select-level isolation structures 72 can be formed through the capping dielectric layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the capping dielectric layer 70.

A lithographic material stack (not shown) including at least a photoresist layer can be formed over the capping dielectric layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the capping dielectric layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the capping dielectric layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings

49 and the support openings 19 can be extend to a top surface of the substrate semiconductor layer 9.

Figure 5:
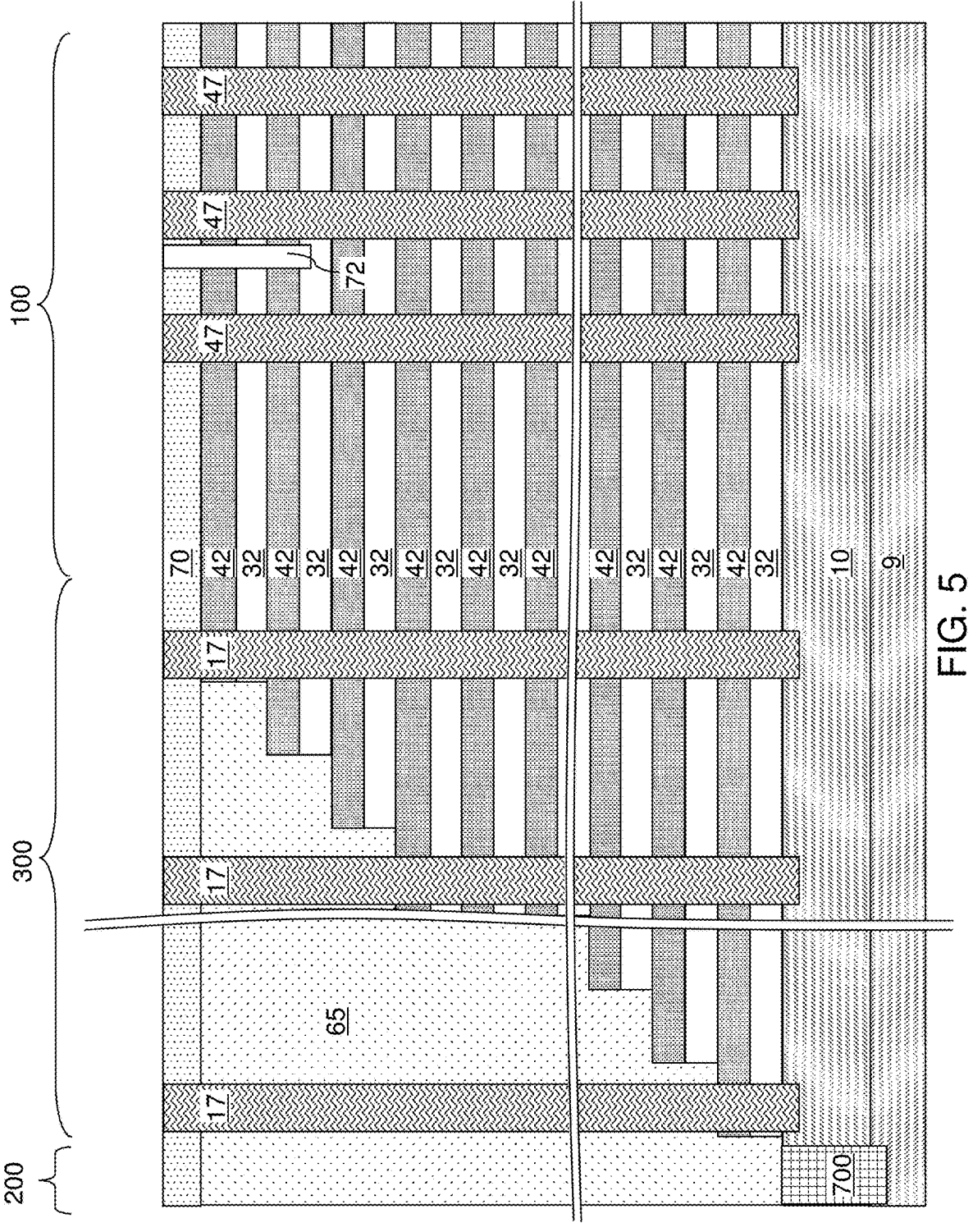
FIG. 5 is a schematic vertical cross-sectional view of the exemplary structure after formation of sacrificial opening fill structures according to an embodiment of the present disclosure.

Referring to FIG. 5, a sacrificial fill material can be deposited in the memory openings 49 and the support openings 17 to form sacrificial opening fill structures (47, 17). Excess portions of the sacrificial fill material can be removed from above the horizontal plane including the top surface of the capping dielectric layer 70. The sacrificial opening fill structures (47, 17) comprise sacrificial memory opening fill structures 47 filling the memory opening 49 and sacrificial support opening fill structures 17 filling the support openings 19. The sacrificial opening fill structures (47, 17) comprise a material that can be removed selective to the materials of the insulating layers 32, the sacrificial material layers 42, the capping dielectric layer 70, and the semiconductor material layer 10. For example, the sacrificial opening fill structures (47, 17) may comprise a silicon-germanium alloy, amorphous silicon, amorphous carbon, diamond-like carbon (DLC), porous or non-porous organosilicate glass, or a polymer material.

Figure 6A:
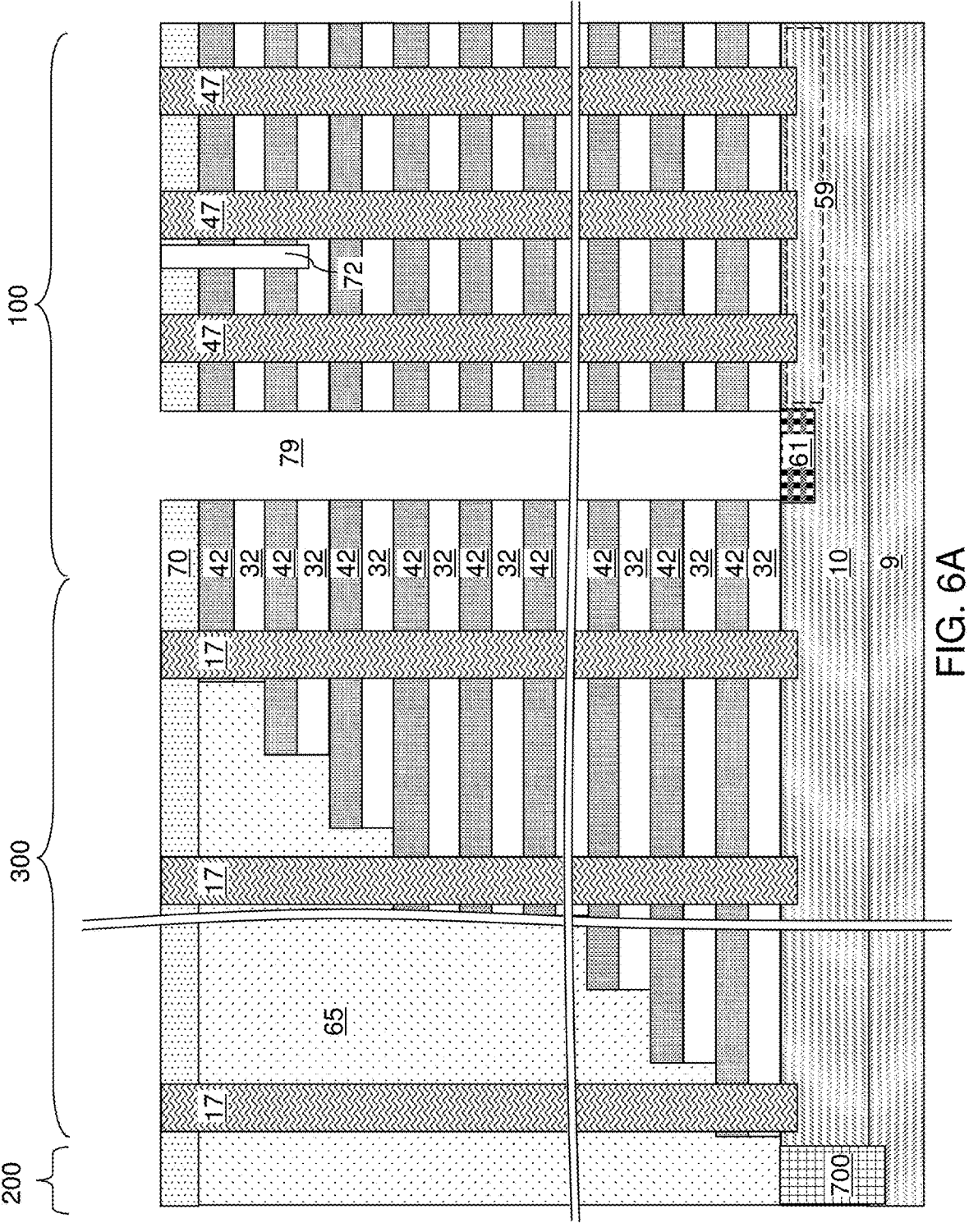
FIG. 6A is a schematic vertical cross-sectional view of the exemplary structure after formation of backside trenches and source regions according to an embodiment of the present disclosure.
Figure 6B:
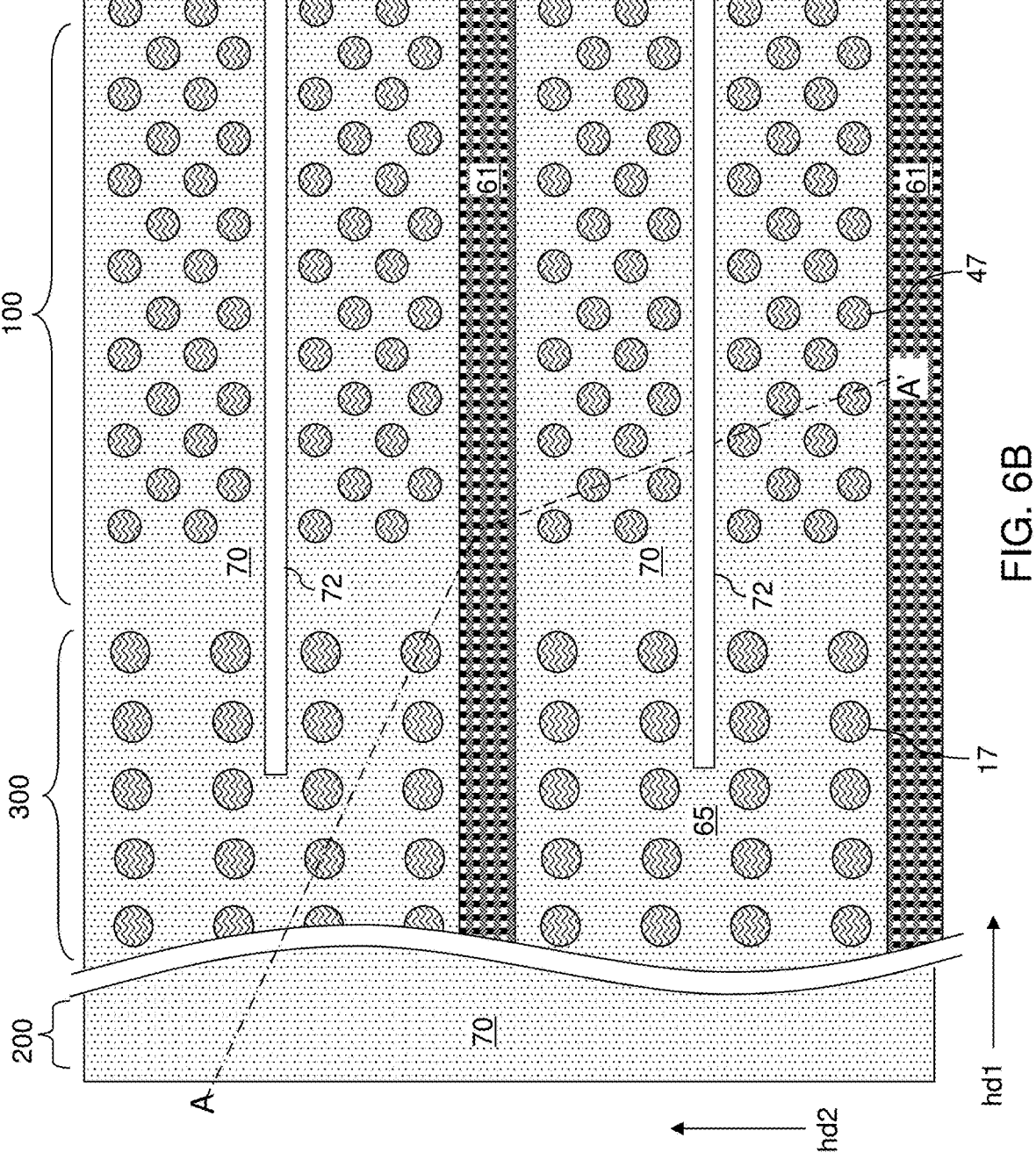
FIG. 6B is a top-down view of the exemplary structure of FIG. 6A. The vertical plane A-A' is the plane of the cross-section for FIG. 6A.

Referring to FIGS. 6A and 6B, a photoresist layer (not shown) can be applied over the capping dielectric layer 70, and is lithographically patterned to form openings in areas between clusters of the sacrificial memory opening fill structures 47. The pattern in the photoresist layer can be transferred through the capping dielectric layer 70, the alternating stack (32, 42) and/or the retro-stepped dielectric material portion 65 employing an anisotropic etch to form backside trenches 79, which vertically extend from the top surface of the capping dielectric layer 70 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction hd2 (e.g., bit line direction) that is perpendicular to the first horizontal direction hd1. The sacrificial memory opening fill structures 47 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of sacrificial memory opening fill structures 47 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channels 59 laterally extend between a respective one of the source regions 61 and a respective set of sacrificial memory opening fill structures 47.

Figure 7:
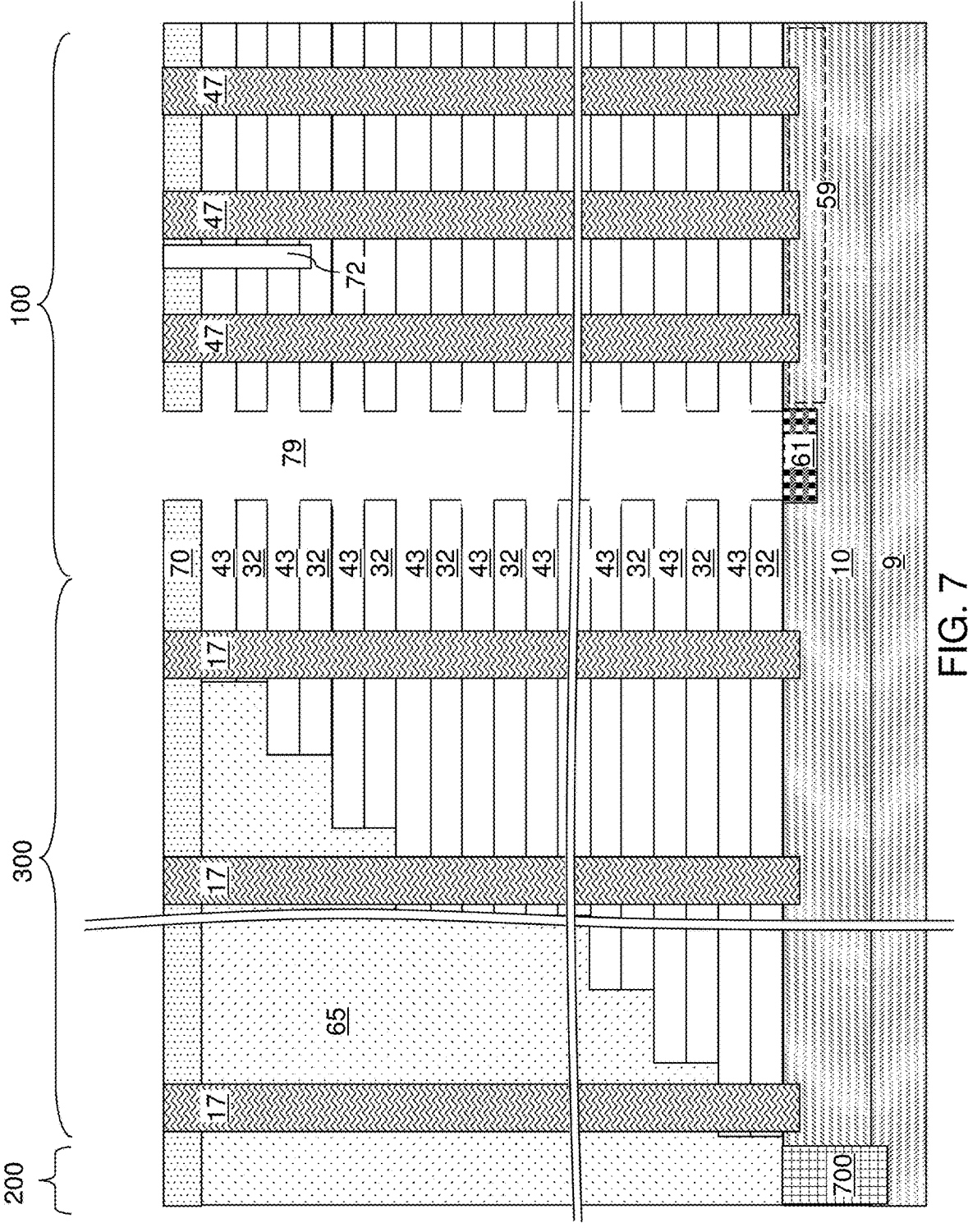
FIG. 7 is a schematic vertical cross-sectional view of the exemplary structure after formation of backside recesses according to an embodiment of the present disclosure.

Referring to FIG. 7, an etchant that selectively etches the second material of the sacrificial material layers 42 with respect to the first material of the insulating layers 32, the material of the capping dielectric layer 70, and the material of the sacrificial opening fill structures (47, 17) can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The retro-stepped dielectric material portion 65 and the sacrificial opening fill structures (47, 17) provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the sacrificial memory opening fill structures 47 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 8:
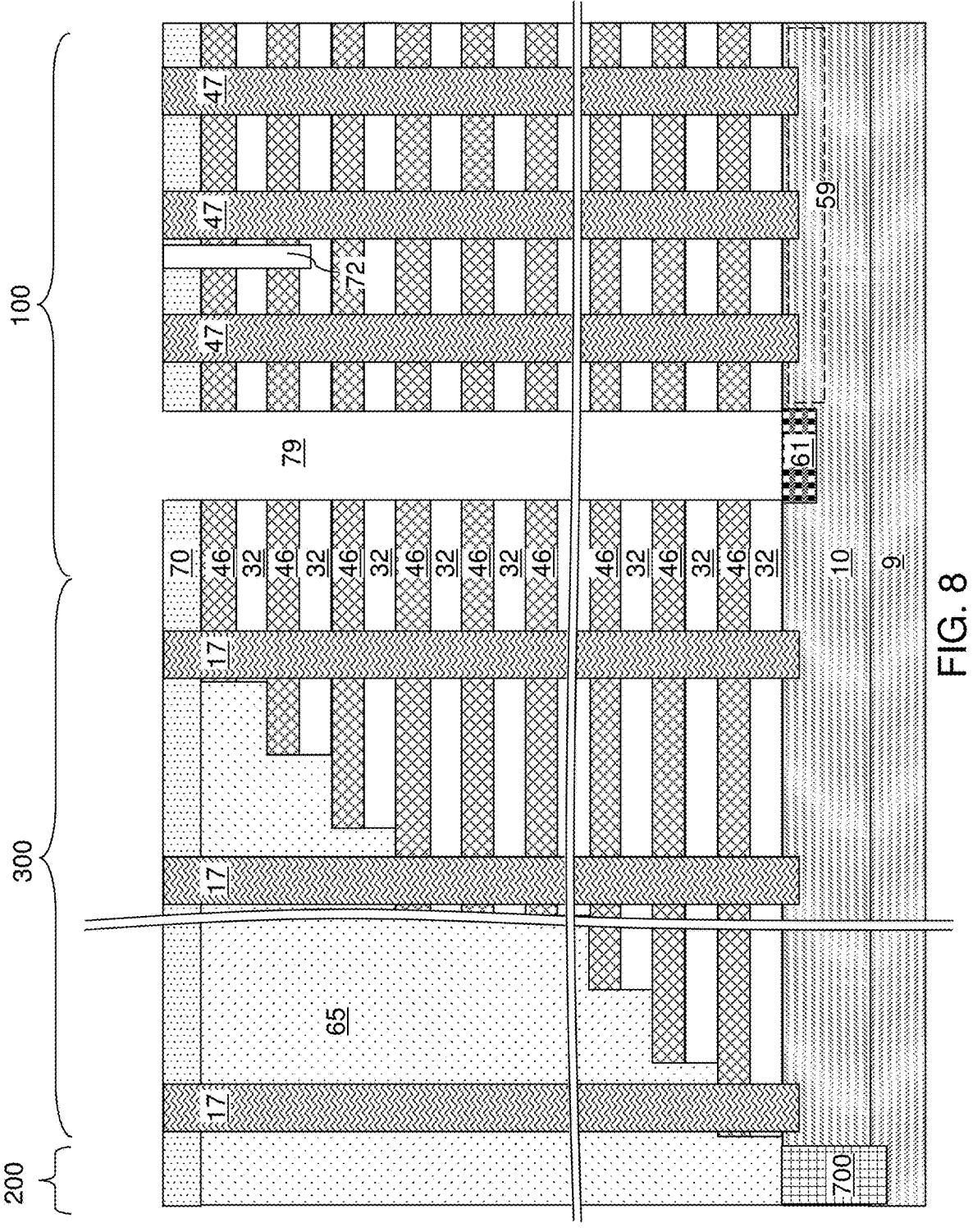
FIG. 8 is a schematic vertical cross-sectional view of the exemplary structure after formation of electrically conductive lines according to an embodiment of the present disclosure.

Referring to FIG. 8, at least one metallic material can be deposited in the backside recesses 43, peripheral regions of the backside trenches 79, and over the capping dielectric layer 70. The at least one metallic material may comprise, for example, a metallic barrier layer and a metallic fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be deposited in the plurality of backside recesses 43, on the sidewalls of the at least one the backside trench 79, and over the top surface of the capping dielectric layer 70 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the sacrificial memory opening fill structures 47 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer (not shown) can be formed on the sidewalls of each backside trench 79 and over the capping dielectric layer 70. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the capping dielectric layer 70. Each sacrificial material layer 42 can be replaced with an electrically conductive layer 46. A backside cavity 79' is present in the portion of each backside trench 79 that is not filled with the continuous metallic material layer.

The deposited metallic material of the continuous electrically conductive material layer is etched back from the sidewalls of each backside trench 79 and from above the capping dielectric layer 70, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices to be subsequently formed within the volumes of the sacrificial memory opening fill structures 47. In other words, each electrically conductive layer 46 can be a word line that functions as a common control gate electrode for the plurality of vertical memory devices to be subsequently formed in the volumes of the sacrificial memory opening fill structures 47.

Upon replacement of the sacrificial material layers 42 with the electrically conductive layers 46, an alternating stack of the insulating layers 32 and the electrically conductive layers 46 is formed. Memory openings filled with the sacrificial memory opening fill structures 47 and support openings filled with the sacrificial support opening fill structures 17 vertically extend through the alternating stack of the insulating layers 32 and the electrically conductive layers 46.

Figure 9A:
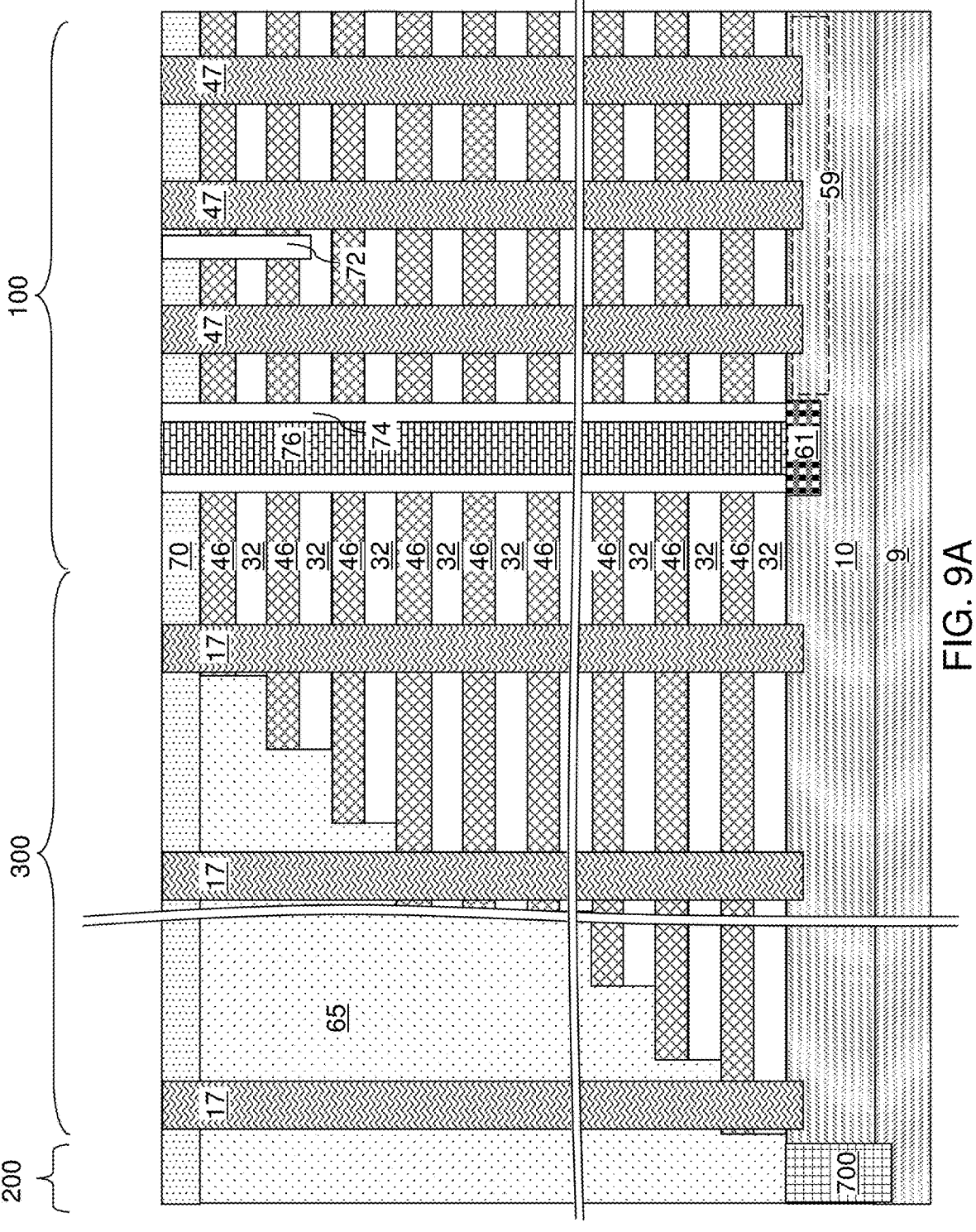
FIG. 9A is a schematic vertical cross-sectional view of the exemplary structure after formation of backside trench fill structures according to an embodiment of the present disclosure.
Figure 9B:
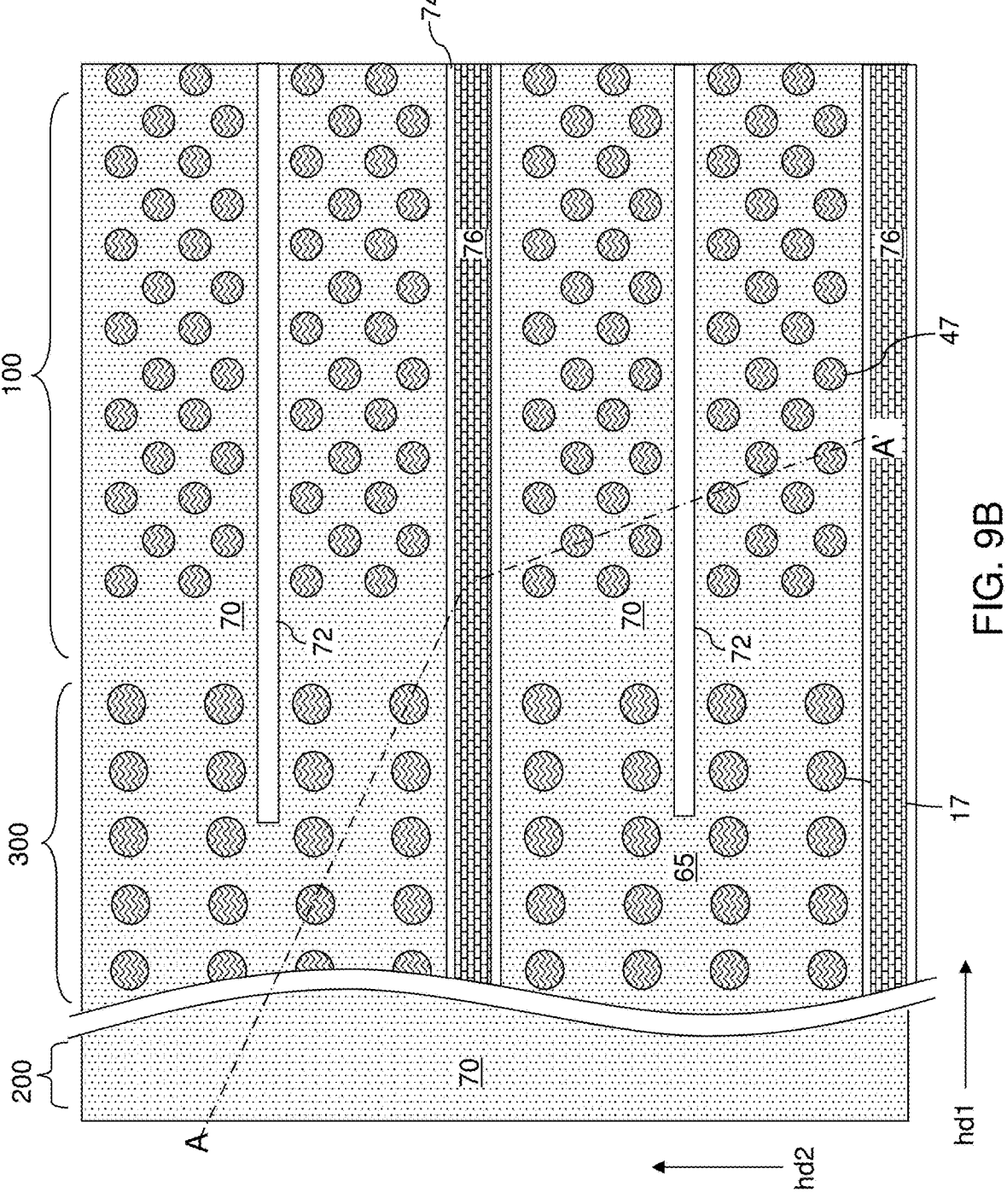
FIG. 9B is a top-down view of the exemplary structure of FIG. 9A. The vertical plane A-A' is the plane of the cross-section for FIG. 9A.

Referring to FIGS. 9A and 9B, an insulating material layer can be deposited in the backside trenches 79 and over the capping dielectric layer 70 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the capping dielectric layer 70 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 10:
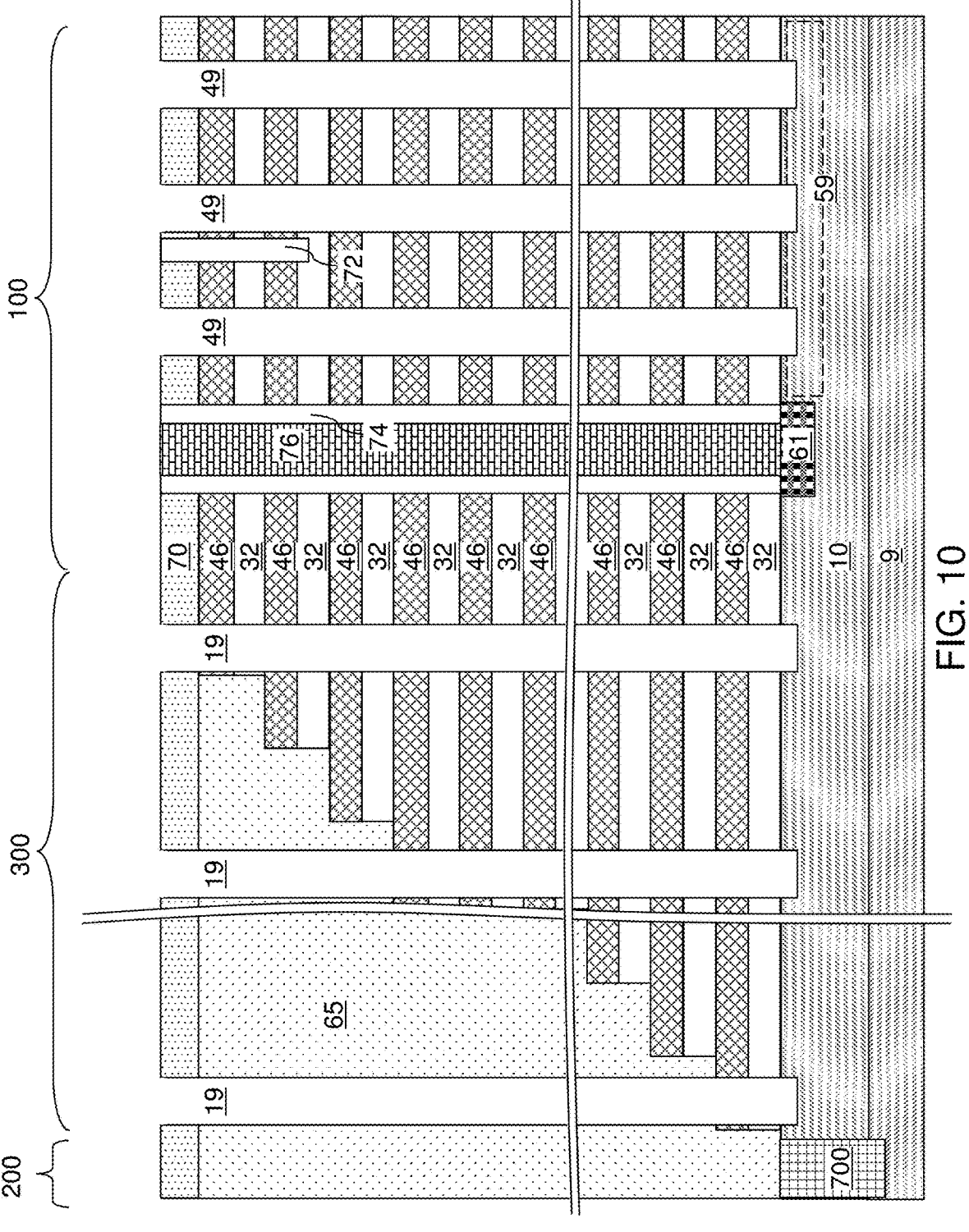
FIG. 10 is a schematic vertical cross-sectional view of the exemplary structure after removal of sacrificial memory opening fill structures according to an embodiment of the present disclosure.

Referring to FIG. 10, a selective etch process can be performed to remove the material of the sacrificial opening fill structures (47, 17) selective to the materials of the insulating layers 32, the electrically conductive layers 46, the capping dielectric layer 70, and the semiconductor material layer 10. For example, if the sacrificial opening fill structures (47, 17) comprise a semiconductor material such as amorphous silicon, then a wet etch process employing hot trimethyl-2 hydroxyethyl ammonium hydroxide ("hot TMY") or tetramethyl ammonium hydroxide (TMAH) may be used to remove the semiconductor material. If the sacrificial opening fill structures (47, 17) comprise amorphous carbon or diamond-like carbon, an ashing process may be employed to ash the sacrificial opening fill structures (47, 17). In some embodiments, a thin sacrificial etch stop liner (not shown) may be formed on sidewalls of the memory openings 49 and the support openings 19 prior to formation of the sacrificial opening fill structures (47, 17), and may be removed after removal of the sacrificial opening fill structures (47, 17) to minimize collateral etching of the alternating stack (32, 42) and the semiconductor material layer 10. Generally, the sacrificial memory opening fill structures 47 and the sacrificial support opening fill structures 17 may be removed selective to the insulating layers 32 and the electrically conductive layers 42. Each void from which a sacrificial memory opening fill structure 47 is removed comprises a memory opening 49. Each void from which a sacrificial support opening fill structure 17 is removed comprises a support opening 19.

Figures 11C, 11D:
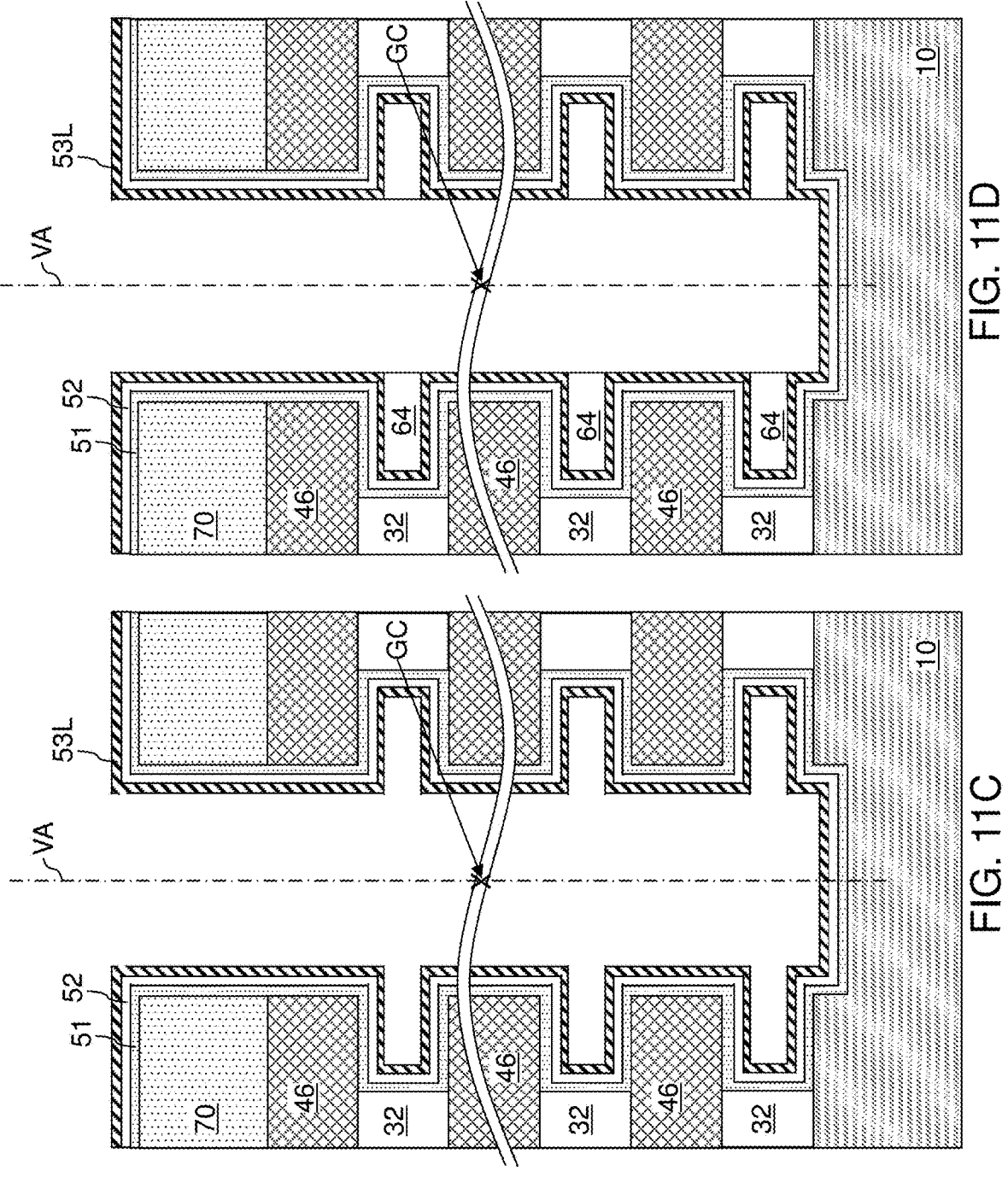
FIGS. 11A-11N are sequential schematic vertical cross-sectional views of a memory opening within the exemplary structure during formation of a first exemplary memory opening fill structure according to a first embodiment of the present disclosure.
Figures 11E, 11F:
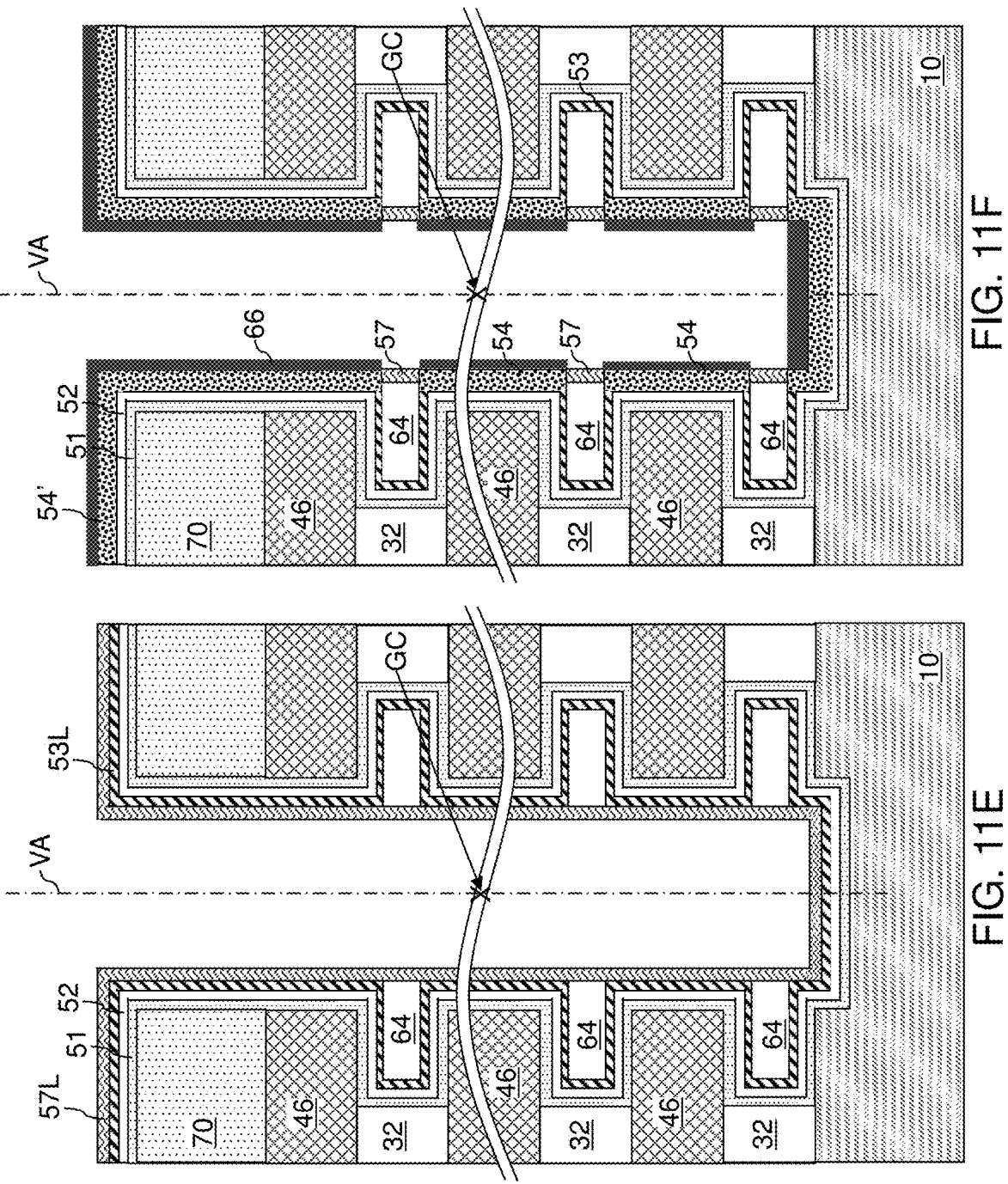
Figures 11G, 11H:
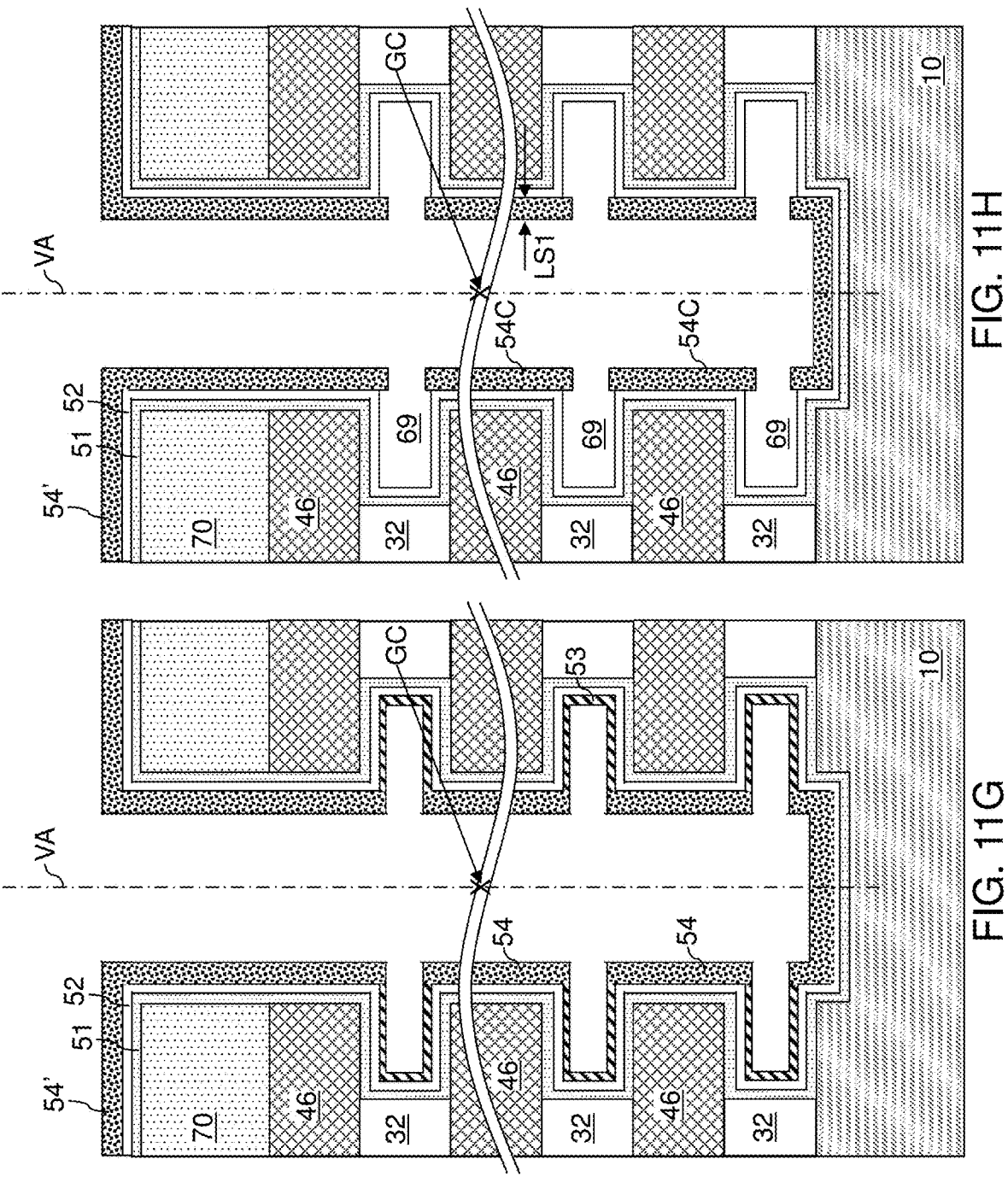
Figures 11I, 11J:
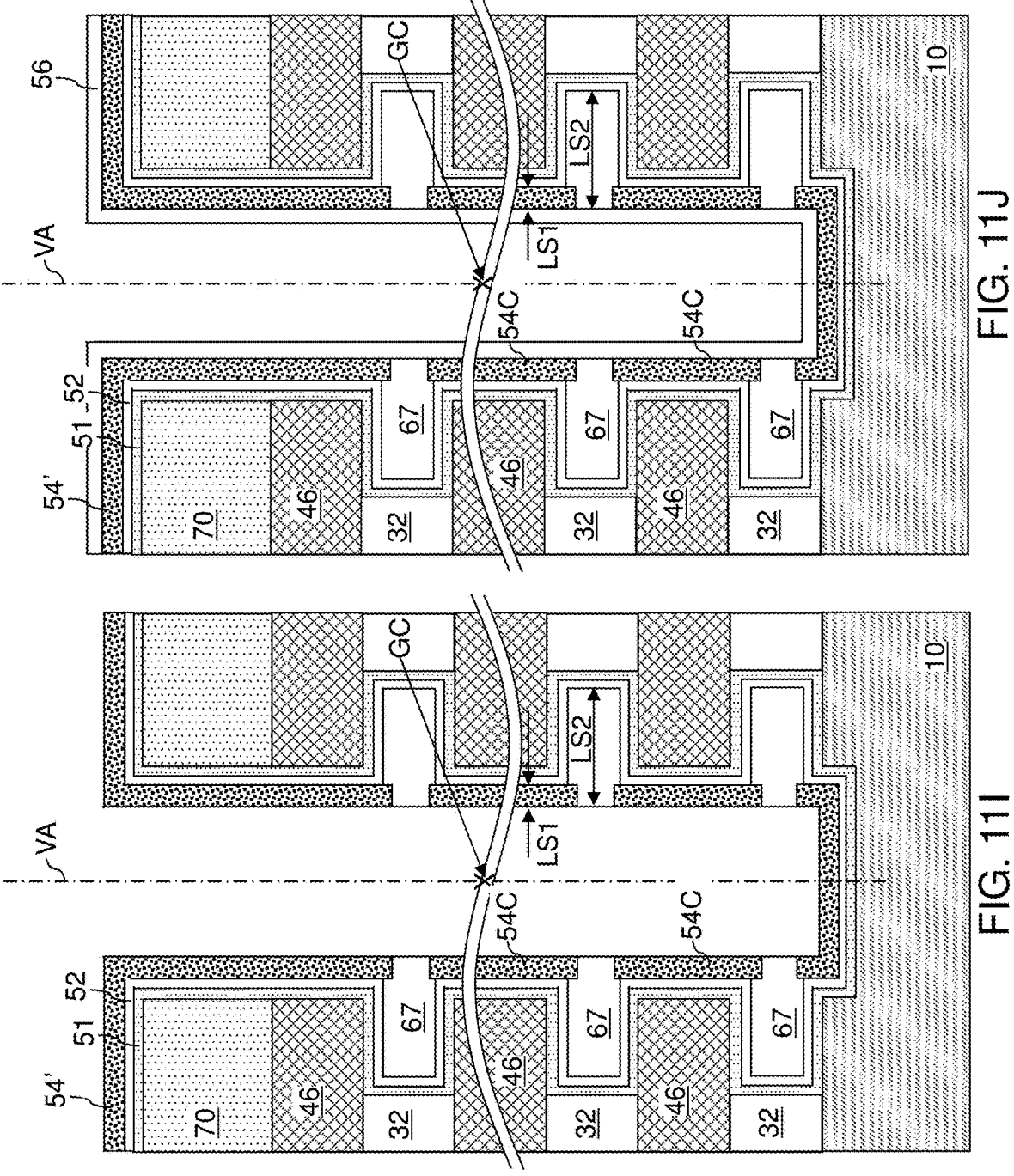
Figures 11K, 11L:
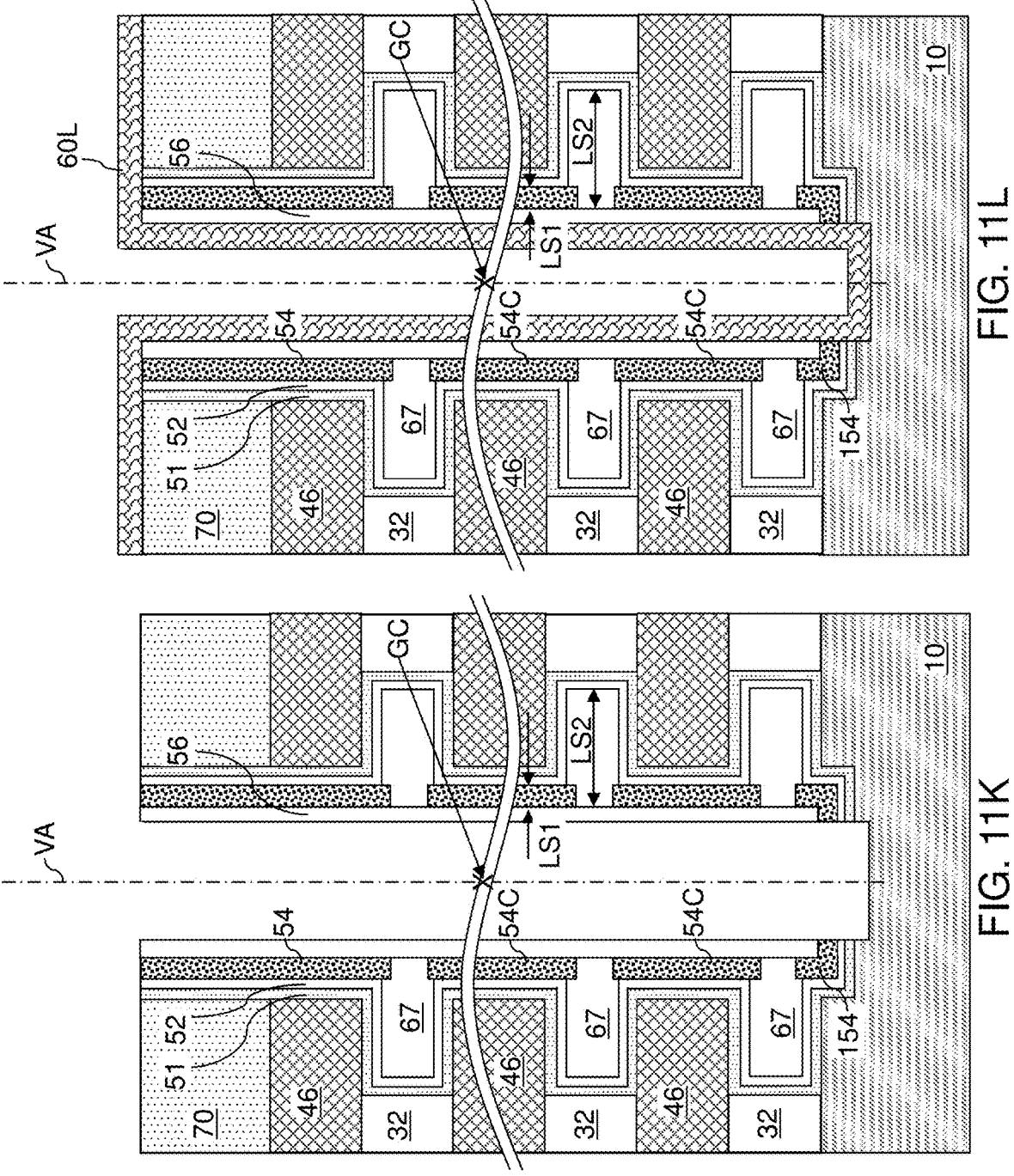
Figures 11M, 11N:
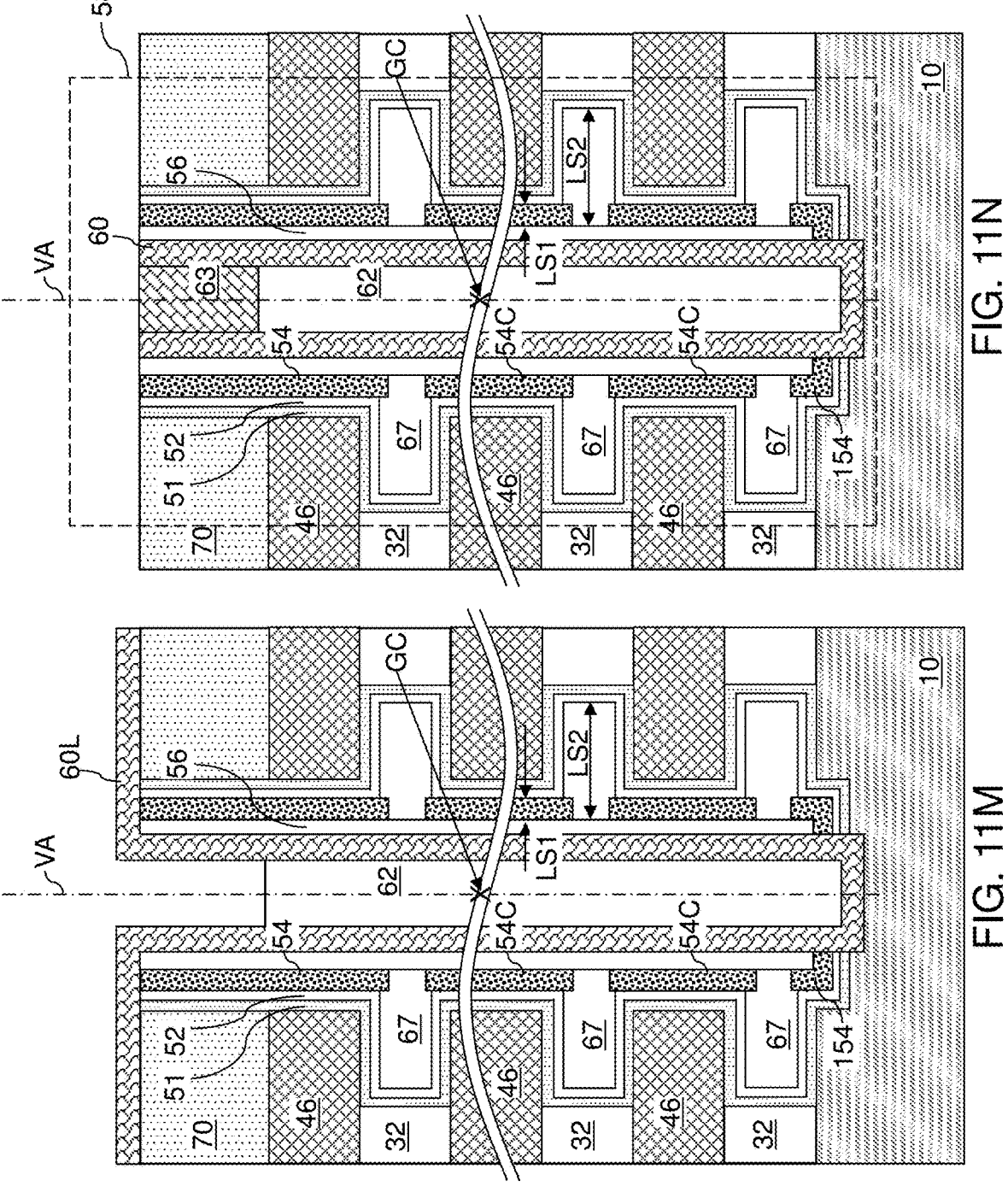

FIGS. 11A-11N are sequential schematic vertical cross-sectional views of a memory opening within the exemplary structure during formation of a first exemplary memory opening fill structure according to a first embodiment of the present disclosure.

Referring to FIG. 11A, a memory opening 49 is illustrated after the processing steps of FIG. 10. A vertical axis VA passing through a geometrical center GC of a memory opening 49 is illustrated.

Referring to FIG. 11B, an isotropic etch process that etches the material of the insulating layers 32 selective to the materials of the electrically conductive layers 46, the capping dielectric layer 70, and the semiconductor material layer 10 can be performed to isotropically recess the physically exposed sidewalls of the insulating layers 32. Sidewalls of the insulating layers 32 are laterally recessed around each memory opening 49 and around each support opening 19 relative to sidewalls of the electrically conductive layers 46. Each memory opening 49 and each support opening 19 can be laterally expanded at levels of the insulating layers 32. The lateral recess distance may be in range from 10 nm to 100 nm, although lesser and greater distances may also be employed. In an illustrative example, if the insulating layers 32 include silicon oxide, the isotropic etch process may comprise a wet etch process employing dilute hydrofluoric acid.

Each memory opening 49 can have a laterally-undulating vertical cross-sectional profile in which first sidewall segments 141 of each memory opening 49 located at the levels of the insulating layers 32 are laterally spaced from a vertical axis VA passing through a geometrical center GC of the respective memory opening by a greater lateral distance than second sidewall segments 142 of the respective memory opening 49 located at the levels of the electrically conductive layers 46. In one embodiment, a vertical stack of annular recess regions 149 can be formed at each level of the insulating layers 32 in the memory opening 49. In one embodiment, each annular recess region 149 may have a respective toroidal shape. While the first sidewall segments 141 (i.e., vertical sidewalls of the insulating layers 32) are shown as having a straight vertical profile, in alternative embodiments, the first sidewall segments 141 may have a convex vertical profile 141C (shown in dashed lines). In the convex vertical profile 141C, the middle portion of the first sidewall segments 141 bows out toward the vertical axis VA compared to the top and bottom portions of the first sidewall segments 141. The shape of the vertical profile of the first sidewall segments 141 depends on the parameters of the isotropic etching used to form the annular recess regions.

Referring to FIG. 11C, at least one blocking dielectric layer (51, 52) can be formed on the physically exposed surfaces of the insulating layers 32 and the electrically conductive layers 46 around each memory opening 49 by a respective conformal deposition process. For example, the at least one blocking dielectric layer (51, 52) may comprise a dielectric metal oxide blocking dielectric layer 51 and a silicon oxide blocking dielectric layer 52. The dielectric metal oxide blocking dielectric layer 51 comprises a dielectric metal oxide material, such as aluminum oxide, and may have a thickness in a range from 1 nm to 10 nm, although lesser and greater thicknesses may also be employed. The silicon oxide blocking dielectric layer 52 comprise silicon oxide, and may have a thickness in a range from 1 nm to 10 nm, although lesser and greater thicknesses may also be employed.

Each of the at least one blocking dielectric layer (51, 52) can have a respective laterally-undulating vertical cross-sectional profile in which first portions of the at least one blocking dielectric layer (51, 52) located at the levels of the insulating layers 32 are laterally spaced from a vertical axis VA passing through a geometrical center GC of a respective memory opening 49 by a greater lateral distance than second portions of the at least one blocking dielectric layer (51, 52) located at the levels of the electrically conductive layers 46.

A continuous metal layer 53L can be deposited over the at least one blocking dielectric layer (51, 52) by a conformal deposition process, such as a chemical vapor deposition process. The continuous metal layer 53L includes a metal that can recrystallize silicon using metal induced lateral crystallization ("MILC"). In one embodiment, the continuous metal layer 53L includes, and/or consists essentially of, a transition metal such as Ni, Mo, Co, Pt, Ti, Ta, W, etc.

The continuous metal layer 53L can be formed directly on sidewall segments of the at least one blocking dielectric layer (51, 52). In one embodiment, first vertically-extending segments of the continuous metal layer 53L are formed at the levels of the electrically conductive layers 46, and second vertically-extending segments of the continuous metal layer 53L are formed at the levels of the insulating layers 32. The second vertically-extending segments of the continuous metal layer 53L are laterally offset from the vertical axis VA passing through the geometrical center GC of the respective memory opening 49 by a greater lateral distance than the first vertically-extending segments of the continuous metal layer 53L are from the vertical axis VA.

The thickness of the continuous metal layer 53L may be in a range from 1 nm to 5 nm, although lesser and greater thicknesses may also be employed.

Referring to FIG. 11D, a sacrificial fill material can be conformally deposited over the continuous metal layer 53L. The sacrificial fill material 53L may comprise a dielectric material, such as silicon oxide, silicon nitride, organosilicate glass, or a polymer material. Volumes of the annular recess regions 149 that are not filled with the at least one blocking dielectric layer (51, 52) and the continuous metal layer 53L can be filled with the sacrificial fill material. Portions of the sacrificial fill material that are located inside a cylindrical volume defined by inner sidewalls of the first vertically-extending segments of the continuous metal layer 53L and portions of the sacrificial fill material overlying the capping dielectric layer 70 can be removed by performing an anisotropic etch process. Remaining portions of the sacrificial fill material located at the levels of the insulating layers 32 and outside the cylindrical vertical plane constitute a vertical stack of sacrificial fill material portions 64.

Referring to FIG. 11E, a semiconductor material layer 57L can be deposited over inner sidewalls of the sacrificial fill material portions 64. For example, the semiconductor material layer 57L includes and/or consists essentially of silicon, such as amorphous silicon. The semiconductor material layer 57L can be deposited over and directly on the first vertically-extending segments of the continuous metal layer 53L. The semiconductor material layer 57L does not directly contact the second vertically-extending segments of the continuous metal layer 53L due to the presence of the sacrificial fill material portions 64 between them at the levels of insulating layers 32. The thickness of the semiconductor material layer 57L may be in a range from 5 nm to 15 nm, such as from 7 nm to 10 nm, although lesser and greater thicknesses may also be employed.

Referring to FIG. 11F, the device is annealed to perform the MILC process to crystallize portions of the semiconductor material layer 57L which contact the respective portions of the continuous metal layer 53L. The anneal process is performed at an elevated temperature that induces formation of a metal-semiconductor alloy (e.g., a metal silicide, such as nickel, molybdenum, cobalt, platinum, titanium, tantalum or tungsten silicide) between the metal of the continuous metal layer 53L and the semiconductor material (e.g., silicon) of the semiconductor material layer 57L which contact each other. For example, the elevated temperature may be in a range from 500 degrees Celsius to 900 degrees Celsius. Preferably, the entire thickness of the continuous metal layer 53L is consumed during the silicidation reaction and is converted to a metal silicide. In contrast, only outer (i.e., proximal) parts of the semiconductor material layer 57L which contact the respective portions of the continuous metal layer 53L are converted to the metal silicide, while the inner (i.e., distal) parts remain as semiconductor material (e.g., silicon) portions (54, 54'). The metal silicide forms a front which diffuses toward the vertical axis VA from the outer surface to the inner surface of the semiconductor material (e.g., silicon) portions (54, 54') to leave a trail of large grain crystalline semiconductor material (e.g., polysilicon) to crystallize the semiconductor material (e.g., silicon) portions (54, 54'). Discrete metal silicide particles may remain in the semiconductor material (e.g., silicon) portions (54, 54').

Remaining portions of the continuous metal layer 53L which surround the sacrificial fill material portions 64 are referred to as metal portions 53. The metal silicide forms metal-semiconductor alloy layer portions (e.g., metal silicide portions) 66 located on the inner surface of the semiconductor material (e.g., silicon) portions (54, 54') in the memory opening 49 and over the capping dielectric layer 70. Portions of the semiconductor material layer 57L which are deposited over the inner sidewalls of the sacrificial fill material portions 64 and which do not contact the respective portions of the continuous metal layer 53L remain as uncrystallized semiconductor material (e.g., amorphous silicon) portions 57 after the MILC anneal process.

Referring to FIG. 11G, the exposed uncrystallized semiconductor material (e.g., amorphous silicon) portions 57 are removed by a first selective etching process. The selective etching process may comprise a hot TMY etch, a TMAH etch or a dilute hydrofluoric acid etch. The first selective etch does not remove the crystallized semiconductor material (e.g., polysilicon) portions (54, 54') because they are covered by the metal-semiconductor alloy layer portions (e.g., metal silicide portions) 66.

The metal-semiconductor alloy layer portions (e.g., metal silicide portions) 66 are then removed by a second selective etching process. The second selective etching process may comprise a Freckle etch for nickel silicide portions 66. Other suitable selective etches may be used for other metal silicide portions 66.

The second selective etch exposes the crystallized semiconductor material (e.g., polysilicon) portions (54, 54'). In one embodiment, the crystallized semiconductor material (e.g., polysilicon) portions (54, 54') include discrete polysilicon elements 54 located at levels of the electrically conductive layers 46 other than the level of the topmost electrically conductive layer 46, and a continuous polysilicon layer 54' can be formed over the capping dielectric layer 70. The continuous polysilicon layer 54' may include a plurality of cylindrical downward-protruding portions that protrude into the memory openings 49 and overlying a respective cylindrical sidewall of the topmost electrically conductive layer 46. In one embodiment, the discrete polysilicon elements 54 include polysilicon which includes particles of a metal silicide, such as nickel, molybdenum, cobalt, platinum, titanium, tantalum or tungsten silicide. A first vertical stack of discrete polysilicon elements 54 is formed at levels of the electrically conductive layers 46. Each discrete polysilicon element 54 within the first vertical stack has a first tubular configuration having a respective first inner sidewall and a respective first outer sidewall.

The sacrificial fill material portions 64 are then removed by a third selective etch. In case the sacrificial fill material portions 64 include silicon oxide, the sacrificial fill material portions 64 can be removed by performing a wet etch process employing dilute hydrofluoric acid.

Referring to FIG. 11H, the metal portions 53 are removed by a fourth selective etch, The metal portions 53 are removed selective to the materials of the first vertical stack of polysilicon elements 54 and selective to the at least one blocking dielectric layer (51, 52) by performing an isotropic etch process, such as a wet etch process, or an atomic layer etch (ALE) process. For example, the fourth selective etch may comprise an iron trichloride etch process for nickel metal portions 53 or a hot phosphoric acid etch process for molybdenum metal portions 53. Annular cavities 69 can be formed in volumes from which the materials of the semiconductor material portions 57, the sacrificial fill material portions 64, and the metal portions 53 are removed.

The polysilicon elements 54 may comprise discrete floating gates. Alternatively, the polysilicon elements 54 may be nitrided to convert them to discrete silicon nitride charge storage regions 54C. The nitridation may comprise a thermal or plasma nitridation in a nitrogen containing ambient, such as an ammonia ambient, at an elevated temperature. The discrete silicon nitride charge storage regions 54C may optionally include metal silicide particles, which enhance charge trapping in the discrete silicon nitride charge storage regions 54C. Each discrete silicon nitride charge storage region 54C may have a width (e.g., lateral spacing) LS1 in a direction perpendicular to the vertical axis VA in a range from 2 nm to 10 nm, such as from 3 nm to 6 nm.

Referring to FIG. 11I, a dielectric fill material can be conformally deposited in the annular cavities 69 by a conformal deposition process. The dielectric fill material may comprise silicon oxide or organosilicate glass. Portions of the dielectric material deposited outside the annular cavities 69 can be removed by performing an anisotropic etch process. In one embodiment, portions of the dielectric fill material can be removed from inside a cylindrical vertical plane including inner sidewalls of the first vertical stack of discrete silicon nitride charge storage elements 54C. Remaining portions of the dielectric fill material filling the annular cavities 69 within each memory opening 49 constitute discrete dielectric material portions 67, which are collectively referred to as a second vertical stack of discrete dielectric material portions 67. The second vertical stack of discrete dielectric material portions 67 can be formed at the levels of the insulating layers 32.

In one embodiment, each discrete dielectric material portion 67 within the second vertical stack may have a second tubular configuration having a respective second inner sidewall and a respective second outer sidewall. Each discrete dielectric material portion 67 within the second vertical stack has a second width (i.e., lateral spacing) LS2 between the respective second inner sidewall and the respective second outer sidewall. The first lateral spacing LS1 is less than the second lateral spacing LS2. For example, the second lateral spacing LS2 may be in a range from 5 nm to 50 nm, such as from 10 nm to 20 nm, although lesser and greater dimensions may also be employed.

In one embodiment, each discrete dielectric material portion 67 within the second vertical stack comprises a respective annular top surface contacting a respective bottom surface segment of the at least one blocking dielectric layer (51, 52), a respective annular bottom surface contacting a respective top surface segment of the at least one blocking dielectric layer (51, 52), and a respective cylindrical surface contacting a respective cylindrical surface segment of the at least one blocking dielectric layer (51, 52). In one embodiment, the inner sidewalls of the discrete silicon nitride charge storage elements 54 within the first vertical stack and the inner sidewalls of the discrete dielectric material portions 67 within the second vertical stack can be located within a same cylindrical vertical plane.

In one embodiment, each discrete silicon nitride charge storage element 54 within the first stack comprises a respective outer cylindrical sidewall contacting a respective cylindrical surface segment of the at least one blocking dielectric layer (51, 52), an annular top surface contacting a respective overlying one of the discrete dielectric material portions 67, and an annular bottom surface contacting a respective underlying one of the discrete dielectric material portions 67.

Referring to FIG. 11J, a tunneling dielectric layer 56 can be formed inner cylindrical sidewalls of the first vertical stack of discrete silicon nitride charge storage elements 54 and the second vertical stack of the inner sidewalls of the discrete dielectric material portions 67 by a conformal deposition process. The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. In one embodiment, each discrete silicon nitride charge storage element 54 within the first vertical stack comprises a respective inner sidewall that contacts the tunneling dielectric layer 56. Each discrete dielectric material portion 67 within the second vertical stack comprises a respective inner sidewall that contacts the tunneling dielectric layer 56.

Referring to FIG. 11K, an anisotropic etch process can be performed to remove horizontally-extending portions of the tunneling dielectric layer 56, the continuous silicon nitride layer 54', and the at least one blocking dielectric layer (51, 52) from above the capping dielectric layer 70 and at the bottom of each memory opening 49 and at the bottom of each support opening 19. The semiconductor material layer 10 can be physically exposed at the bottom of each memory opening 49 and at the bottom of each support opening 19. Optionally, a sacrificial cover layer (not shown) can be conformally deposited over the tunneling dielectric layer 56 prior to the anisotropic etch process, and can be anisotropically etched prior to etching the horizontally-extending portions of the tunneling dielectric layer 56, the continuous silicon nitride layer 54', and the at least one blocking dielectric layer (51, 52). In this case, the sacrificial cover layer can be removed after the anisotropic etch process.

Each remaining cylindrical portion of the continuous silicon nitride layer 54' in a respective memory opening 49 constitutes an additional discrete silicon nitride charge storage element 54. A remaining portion of the silicon nitride material located at a bottom portion of each memory opening 49 and at a bottom portion of each support opening 19 constitutes a bottom silicon nitride portion 154. The metal-semiconductor alloy material portion vertically extends through a horizontal plane including an interface between the alternating stack (32, 46) and the substrate (9, 10), and has a same material composition as the discrete silicon nitride charge storage elements 54.

Referring to FIG. 11L, a semiconductor channel material layer 60L can be conformally deposited over the tunneling dielectric layer 56 in each memory opening 49 and in each support opening 19. The semiconductor channel material layer 60L includes a first conductivity type semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers and portions (51, 52, 54, 56, 60L).

Referring to FIG. 11M, a dielectric core layer may be deposited in the cavity 49' to fill any remaining unfilled volume within each memory opening 49 and within each support opening 19. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the capping dielectric layer 70 may be removed, for example, by a recess etch. The recess etch continues until top surfaces of the remaining portions of the dielectric core layer are recessed to a height at, or about, the bottom surface of the capping dielectric layer 70. Each remaining portion of the dielectric core layer constitutes a dielectric core 62.

Referring to FIG. 11N, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material and horizontally-extending portions of the semiconductor channel material layer 60L may be removed from above the horizontal plane including the top surface of the capping dielectric layer 70 by a planarization process such as a chemical mechanical planarization (CMP) process. Each remaining portion of the doped semiconductor material of the second conductivity type constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The doped semiconductor material may be, for example, doped polysilicon. Each remaining portion of the semiconductor channel material layer 60L constitutes a vertical semiconductor channel 60. Within each memory opening 49, a drain region 63 contacts an upper end of a vertical semiconductor channel 60.

The set of all material portions filling a memory opening 49 is herein referred to as a memory opening fill structure 58. Generally, an alternating stack of insulating layers 32 and electrically conductive layers 46 can be located over a substrate (9, 10). Memory openings 49 vertically extend through the alternating stack (32, 46). A memory opening fill structure 58 can be located within each memory opening 49. Each memory opening fill structure 58 comprises a first vertical stack of discrete silicon nitride charge storage elements 54 located at levels of the electrically conductive layers 46 and vertically spaced from each other, a second vertical stack of discrete dielectric material portions 67 located at levels of the insulating layers 32 and vertically spaced from each other, a tunneling dielectric layer 56 in contact with the first vertical stack and the second vertical stack, and a vertical semiconductor channel 60 in contact with the tunneling dielectric layer 56.

FIGS. 12A-12E are sequential schematic vertical cross-sectional views of a memory opening within the exemplary structure during formation of a second exemplary memory opening fill structure according to a second embodiment of the present disclosure. In the second embodiment, an aluminum-induced layer exchange process (ALILE) process is used to crystallize the amorphous silicon layer instead of the MILC process of the first embodiment.

Figures 12A, 12B:
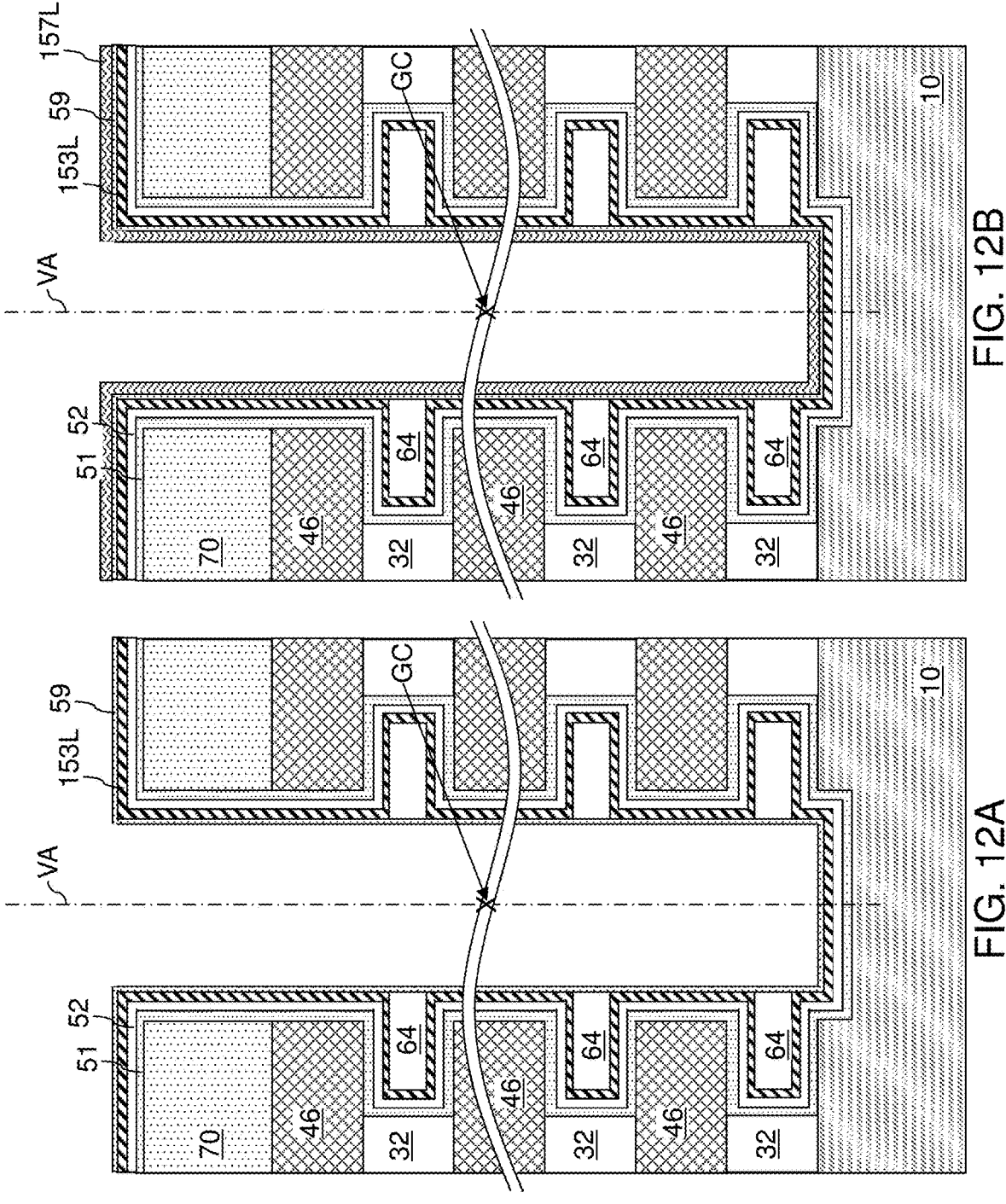
FIGS. 12A-12E are sequential schematic vertical cross-sectional views of a memory opening within the exemplary structure during formation of a second exemplary memory opening fill structure according to a second embodiment of the present disclosure.

Referring to FIG. 12A, a configuration of a memory opening for forming the second exemplary memory opening fill structure is illustrated, which can be derived from the configuration of the memory opening illustrated in FIG. 11D by employing a continuous ALILE metal layer 153L instead of the silicide forming continuous metal layer 53L used for MILC described above. ALILE metals, such as aluminum or silver interdiffuse with amorphous silicon to crystallize the amorphous silicon and to physically switch places with the silicon. Examples of ALILE process are described, for example, in Van Gestel, Dries; Gordon, Ivan; Poortmans, Jozef, *Metal induced crystallization of amorphous silicon for photovoltaic solar cells*, Physics Procedia, Vol. 11, pp. 196-199 (2011), and Scholz, M., Gjukic M., and Stutzmann M., *Silver-induced layer exchange for the low-temperature preparation of intrinsic polycrystalline silicon films*, Applied Physics Letters 94.1 (2009): 012108, the entire contents of which are incorporated herein by reference. Thus, the ALILE process is not limited to using aluminum, and may use silver instead. The continuous metal layer 153L can be deposited by a conformal deposition process such as a chemical vapor deposition process. The thickness of the continuous metal layer 153L can be in a range from 1 nm to 20 nm, although lesser and greater thicknesses may also be employed.

Subsequently, sacrificial fill material portions 64 can be formed in the same manner as described above. A silicon oxide liner 59 can be subsequently deposited on the continuous metal layer 153L and on the inner sidewalls of the sacrificial fill material portions 64. The silicon oxide liner 59 is thin enough to enable the ALILE crystallization process to process in a subsequent processing step. For example, the silicon oxide liner 59 may have a thickness in a range from 0.5 nm to 3 nm, such as from 1 nm to 2 nm, although lesser and greater thicknesses may also be employed.

Referring to FIG. 12B, a semiconductor material layer 157L can be deposited over inner sidewalls of the sacrificial fill material portions 64. The semiconductor material layer 157L may comprise amorphous silicon. The semiconductor material layer 157L can be deposited over and directly on first vertically-extending segments of the continuous metal layer 153L that are located at levels of the electrically conductive layers 46, and does not directly contact the second vertically-extending segments of the continuous metal layer 153L located at levels of the insulating layers 32. The thickness of the semiconductor material layer 157L may be in a range from 1 nm to 30 nm, such as from 2 nm to 20 nm, although lesser and greater thicknesses may also be employed.

Figures 12C, 12D:
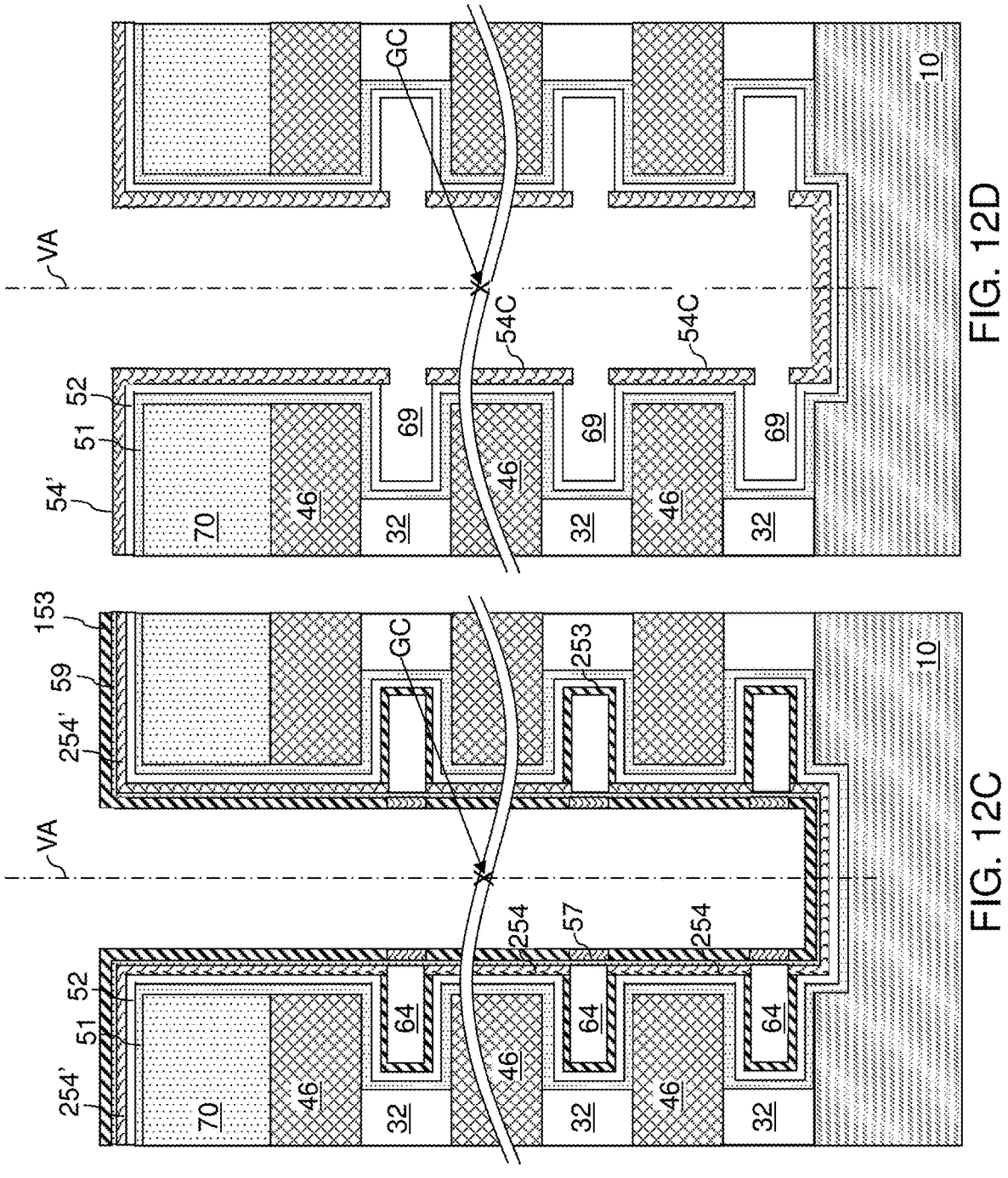

Referring to FIG. 12C, an anneal process can be performed to induce the ALILE crystallization material of the semiconductor material layer 157L (e.g., conversion of amorphous silicon to polysilicon by diffusion of the metal through the amorphous silicon). The elevated temperature of the anneal process may be suitably selected to enable the induce the ALILE crystallization. In an illustrative example, the elevated temperature may be in a range from 200 degrees Celsius to 600 degrees Celsius. Generally, the elevated temperature for the anneal process is lower than conventional anneal process for crystallizing an amorphous semiconductor material due to the catalytic role that the metal atoms play during the ALILE crystallization.

Generally, the material of the metal layer 153L and the material of the semiconductor material layer 157L exchange places through the silicon oxide liner 59 during the ALILE crystallization. Thus, discrete semiconductor (e.g., polysilicon) charge storage elements 254 are formed at levels of the electrically conductive layers 46 other than the level of the topmost electrically conductive layer 46. A continuous semiconductor (e.g., polysilicon) layer 254' can be formed over the capping dielectric layer 70. The continuous semiconductor layer 254' may include a plurality of cylindrical downward-protruding portions that protrude into the memory openings 49 and overlying a respective cylindrical sidewall of the topmost electrically conductive layer 46. In one embodiment, the discrete semiconductor charge storage elements 254 consist essentially of a polycrystalline semiconductor material, such as polysilicon.

Portions of the metal layer 153L that diffuse through the silicon oxide liner 59 form first metal portions 153 that are physically exposed to the cavity within the memory opening 49. Portions of the metal layer 153L that are distal from the silicon oxide liner 59 and separated from the semiconductor material layer 157L by the sacrificial fill material portions 64 remain in place, and form second metal portions 253. Portions of the semiconductor material layer 157L that do not contact the metal layer 153L and that are located on sidewalls of the sacrificial fill material portions 64 remain in place, and form uncrystallized semiconductor material portions (e.g., amorphous silicon portions) 57.

Referring to FIG. 12D, the uncrystallized semiconductor material portion 57, the silicon oxide liner 59, the sacrificial fill material portions 64, the first metal portions 153, and the second metal portions 253 may be removed in any order provided that the first stack of discrete semiconductor charge storage elements 254 and the continuous semiconductor layer 254' are not removed. For example, the semiconductor material portions 57 and the first metal portions 153 can be removed by performing a reactive ion etch. Subsequently, the physically exposed portions of the silicon oxide liner 59 and the sacrificial fill material portions 64 can be removed by performing a selective wet etch process (e.g., dilute hydrofluoric acid etch), and the second metal portions 253 can be removed by yet another wet etch process (e.g., hydrochloric acid etch).

The discrete semiconductor charge storage elements 254 and the continuous semiconductor layer 254' may optionally be nitrided as described above to be converted to the respective discrete silicon nitride charge storage regions 54C and continuous silicon nitride layer 54'. The configuration of the exemplary structure illustrated in FIG. 12D is similar to the configuration of the exemplary structure illustrated in FIG. 11H.

Figure 12E:
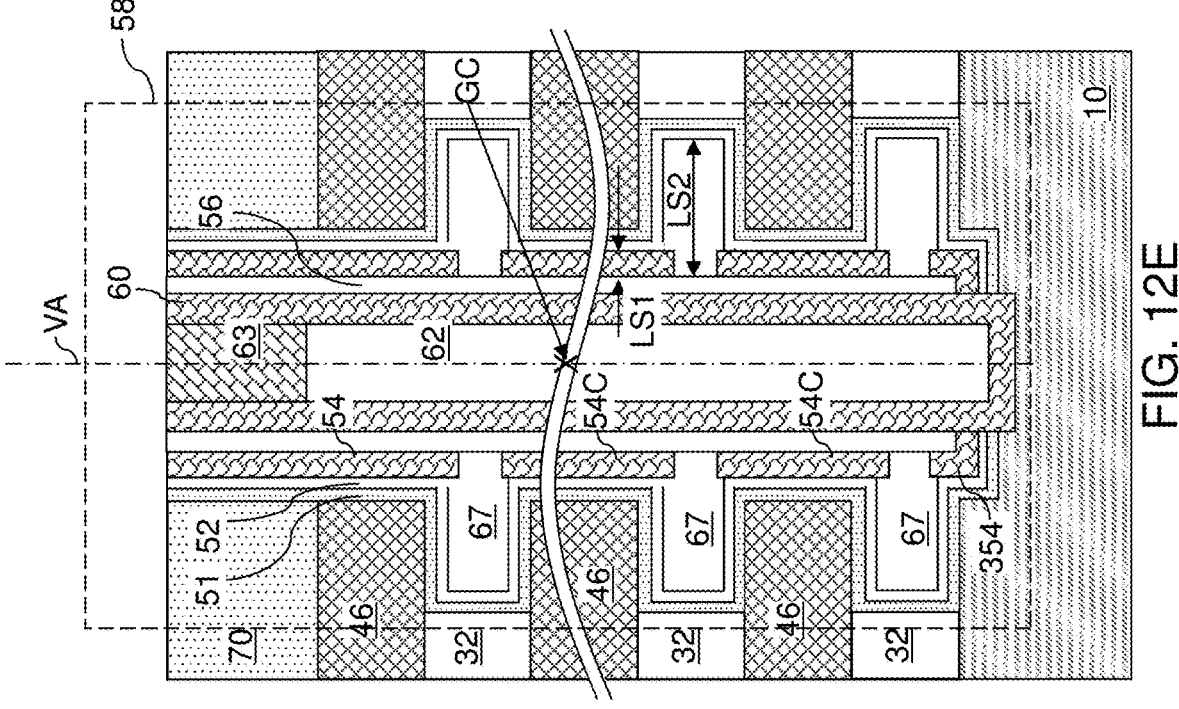

Referring to FIG. 12E, the processing steps of FIGS. 11I-11N can be performed with any needed changes. A memory opening fill structure 58 is formed in each memory opening 49.

Figure 13:
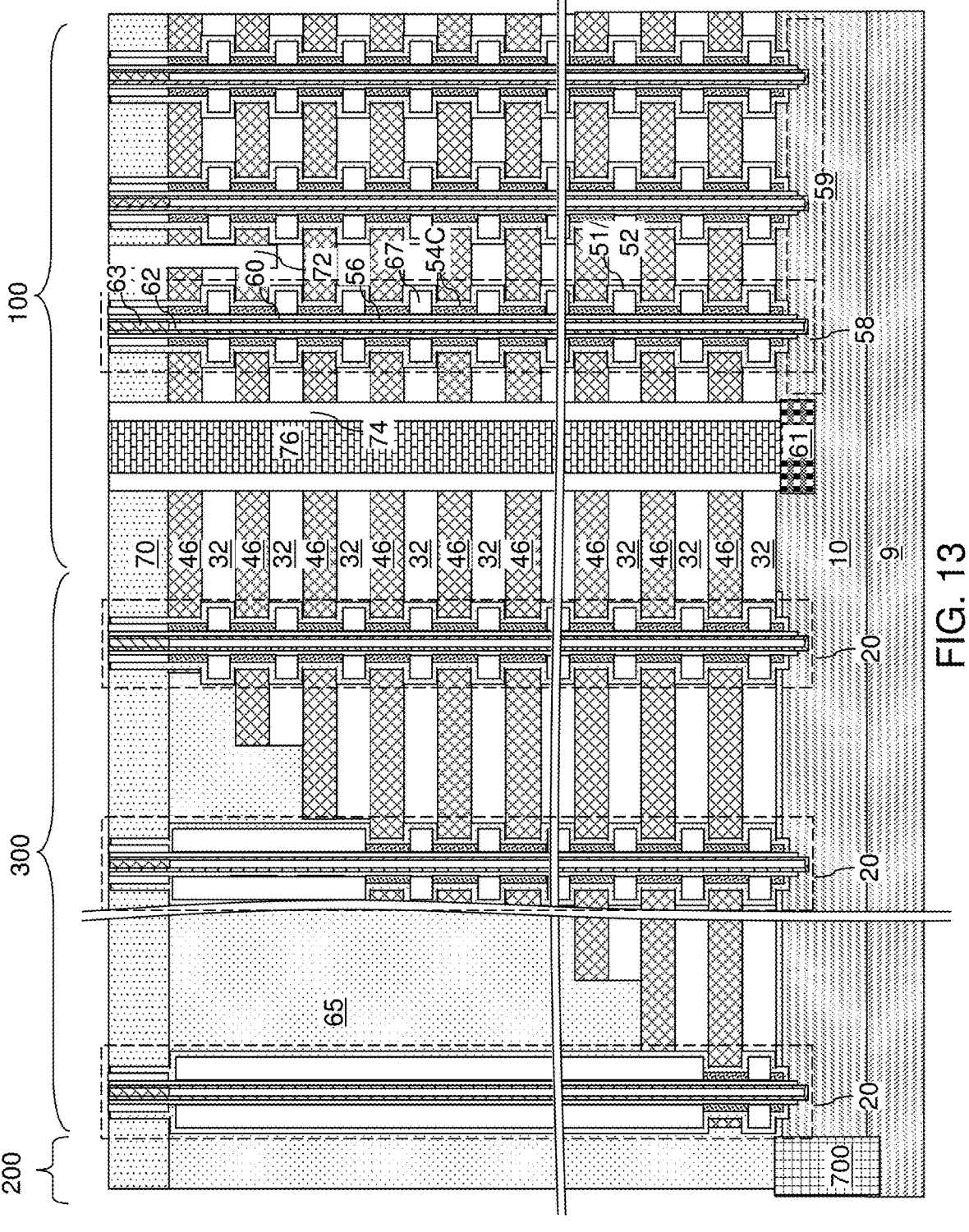
FIG. 13 is a schematic vertical cross-sectional view of the exemplary structure after formation of memory opening fill structures and support pillar structures according to an embodiment of the present disclosure.

Referring to FIG. 13, the exemplary structure is illustrated at the processing step of FIG. 11N or FIG. 12E. A memory opening fill structure 58 is formed in each memory opening 49, and a support pillar structure 20 is formed in each support opening 19.

Figure 14A:
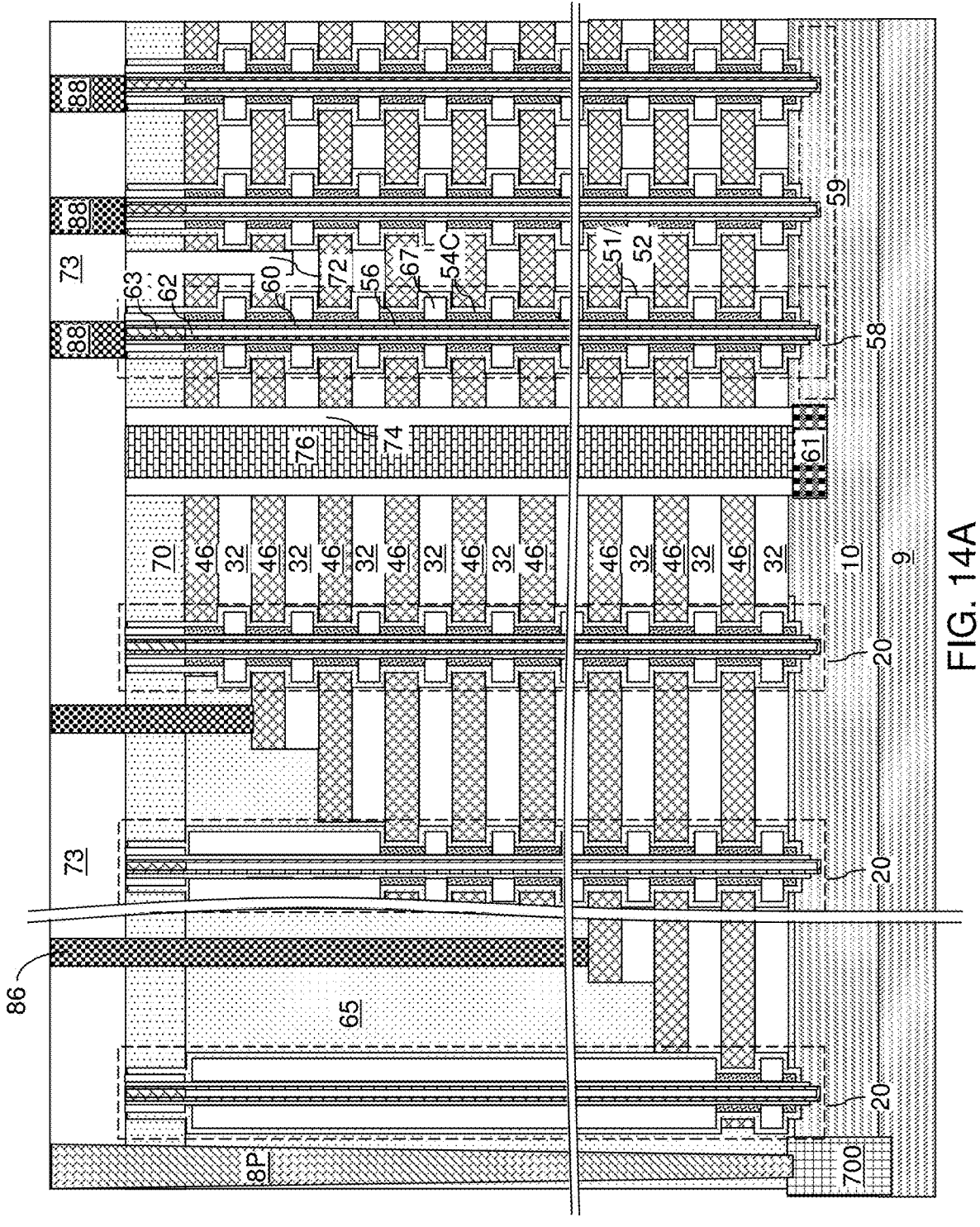
FIG. 14A is a schematic vertical cross-sectional view of the exemplary structure after formation of contact via structures according to an embodiment of the present disclosure.
Figure 14B:
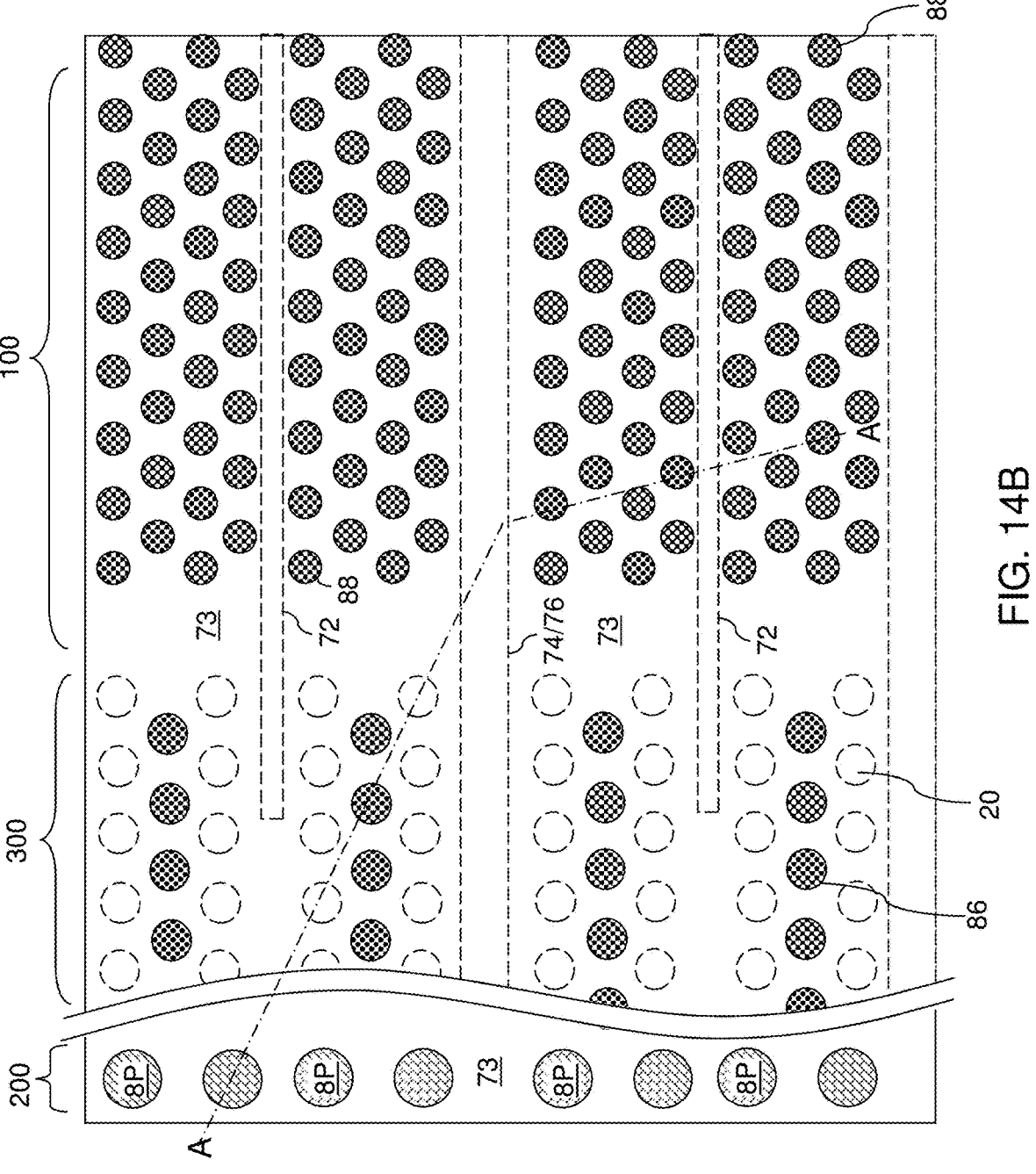
FIG. 14B is a top-down view of the exemplary structure of FIG. 14A. The vertical plane A-A' is the plane of the schematic vertical cross-sectional view of FIG. 14A.

Referring to FIGS. 14A and 14B, a contact-level dielectric layer 73 can be formed over the capping dielectric layer 70. Contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Figure 15:
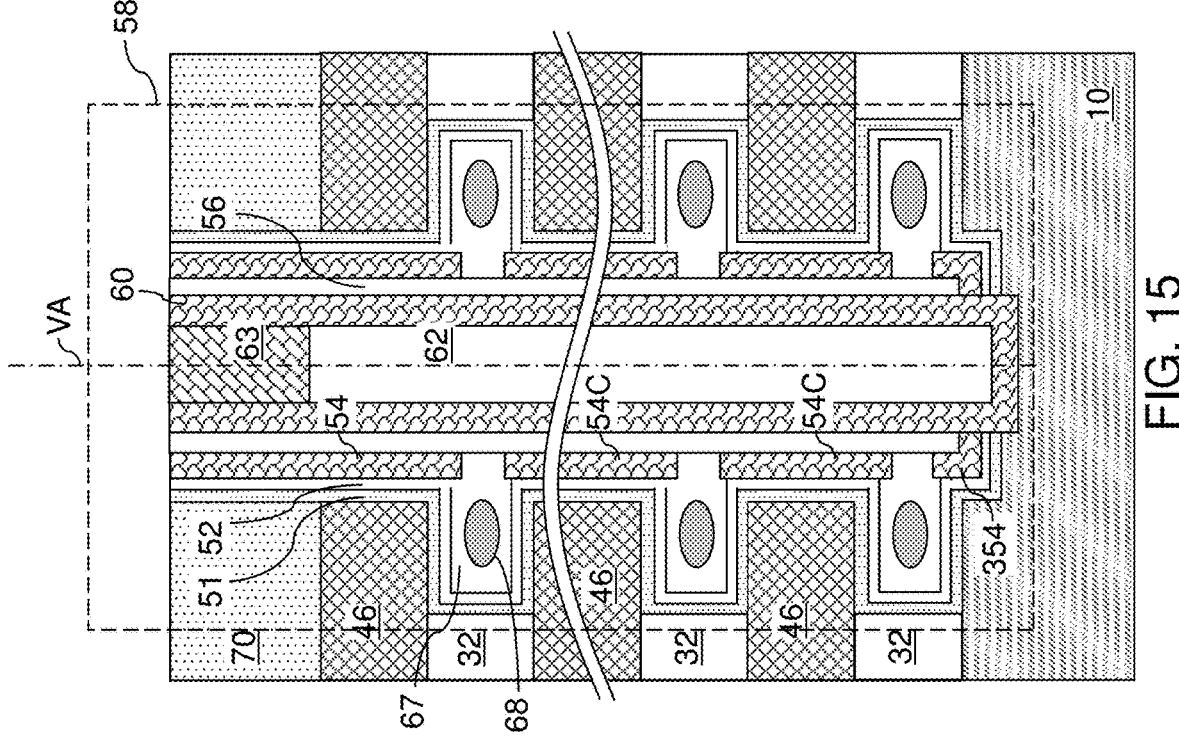
FIG. 15 is a vertical cross-sectional view of a third exemplary memory opening fill structure according to a third embodiment of the present disclosure.

Referring to FIG. 15, the discrete dielectric material portions 67 embed air gaps 68 therein in a third embodiment of the present disclosure. The air gaps 68 can be formed by only partially filling the annular cavities 69 with the dielectric fill material used to form the discrete dielectric material portions 67 at the step shown in FIG. 11I or 12E.

Referring to all drawings and according to various embodiments of the present disclosure, a memory device comprises: an alternating stack (32, 46) of insulating layers 32 and electrically conductive layers 46; a memory opening 49 vertically extending through the alternating stack (32, 46); and a memory opening fill structure 58 located within the memory opening 49 and comprising: a first vertical stack of discrete charge storage elements (54C) located at levels of the electrically conductive layers 46 and vertically spaced from each other; a second vertical stack of discrete dielectric material portions 67 located at levels of the insulating layers 32 and vertically spaced from each other; a tunneling dielectric layer 56 in contact with the first vertical stack and the second vertical stack; and a vertical semiconductor channel 60 in contact with the tunneling dielectric layer 56. In one embodiment, the memory opening 49 has a laterally-undulating vertical cross-sectional profile in which first sidewall segments of the memory opening 49 located at the levels of the insulating layers 32 are laterally spaced from a vertical axis VA passing through a geometrical center GC of the memory opening 49 by a greater lateral distance than second sidewall segments of the memory openings located at the levels of the electrically conductive layers 46.

In one embodiment, each discrete charge storage element 54C within the first vertical stack comprises a respective inner sidewall that contacts the tunneling dielectric layer 56; and each discrete dielectric material portion within the second vertical stack comprises a respective inner sidewall that contacts the tunneling dielectric layer 56. In one embodiment, the inner sidewalls of the discrete charge storage elements 54C within the first vertical stack and the inner sidewalls of the discrete dielectric material portions 67 within the second vertical stack are located within a same cylindrical vertical plane.

In one embodiment, each discrete charge storage element 54C within the first vertical stack has a first tubular configuration having a respective first inner sidewall and a respective first outer sidewall; and each discrete dielectric material portion 67 within the second vertical stack has a second tubular configuration having a respective second inner sidewall and a respective second outer sidewall. In one embodiment, each discrete charge storage element (54, 254)

within the first vertical stack has a first lateral spacing LS1 between the respective first inner sidewall and the respective first outer sidewall; each discrete dielectric material portion within the second vertical stack has a second lateral spacing LS2 between the respective second inner sidewall and the respective second outer sidewall; and the first lateral spacing LS1 is less than the second lateral spacing LS2.

In one embodiment, the memory opening fill structure 58 further comprises at least one blocking dielectric layer (51, 52) having a respective laterally-undulating vertical cross-sectional profile in which first portions of the at least one blocking dielectric layer (51, 52) located at the levels of the insulating layers 32 are laterally spaced from a vertical axis VA passing through a geometrical center GC of the memory opening by a greater lateral distance than second portions of the at least one blocking dielectric layer (51, 52) located at the levels of the electrically conductive layers 46.

In one embodiment, each discrete dielectric material portion 67 within the second vertical stack comprises: a respective annular top surface contacting a respective bottom surface segment of the at least one blocking dielectric layer (51, 52); a respective annular bottom surface contacting a respective top surface segment of the at least one blocking dielectric layer (51, 52); and a respective cylindrical surface contacting a respective cylindrical surface segment of the at least one blocking dielectric layer (51, 52).

In one embodiment, each discrete charge storage element 54C with the first stack comprises: a respective outer cylindrical sidewall contacting a respective cylindrical surface segment of the at least one blocking dielectric layer (51, 52); an annular top surface contacting a respective overlying one of the discrete dielectric material portions 67; and an annular bottom surface contacting a respective underlying one of the discrete dielectric material portions 67.

In one embodiment, the discrete charge storage elements 54C comprises silicon nitride, and optionally containing metal silicide particles embedded in the silicon nitride.

In one embodiment, the memory opening fill structure 58 comprises a material portion (154, 354) vertically extending through a horizontal plane including an interface between the alternating stack (32, 46) and the substrate and having a same material composition as the discrete charge storage elements 54C. In one embodiment, the memory opening fill structure 58 comprises a drain region 63 contacting an upper end of the vertical semiconductor channel 60.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:

an alternating stack of insulating layers and electrically conductive layers;

a memory opening vertically extending through the alternating stack; and a memory opening fill structure located within the memory opening and comprising:

a first vertical stack of discrete charge storage elements located at levels of the electrically conductive layers and vertically spaced from each other;

a second vertical stack of silicon oxide discrete dielectric material portions located at levels of the insulating layers and vertically spaced from each other and in direct contact with a respective one of the discrete charge storage elements;

at least one blocking dielectric layer vertically extending continuously through the alternating stack and contacting outer sidewalls of the discrete charge storage elements of the first vertical stack at each level of the electrically conductive layers;

a tunneling dielectric layer in contact with the first vertical stack and the second vertical stack; and a vertical semiconductor channel in contact with the tunneling dielectric layer, and wherein the memory opening has a laterally-undulating vertical cross-sectional profile in which first sidewall segments of the memory opening located at the levels of the insulating layers are laterally spaced from a vertical axis passing through a geometrical center of the memory opening by a greater lateral distance than second sidewall segments of the memory opening located at the levels of the electrically conductive layers.

2. The memory device of claim 1, wherein each discrete charge storage element within the first vertical stack comprises a respective inner sidewall that contacts the tunneling dielectric layer.

3. The memory device of claim 2, wherein each discrete dielectric material portion within the second vertical stack comprises a respective inner sidewall that contacts the tunneling dielectric layer.

4. The memory device of claim 3, wherein the inner sidewalls of the discrete charge storage elements within the first vertical stack and the inner sidewalls of the discrete dielectric material portions within the second vertical stack are located within a same cylindrical vertical plane.

5. The memory device of claim 1, wherein:

each discrete charge storage element within the first vertical stack has a first tubular configuration having a respective first inner sidewall and a respective first outer sidewall; and each discrete dielectric material portion within the second vertical stack has a second tubular configuration having a respective second inner sidewall and a respective second outer sidewall.

6. The memory device of claim 5, wherein:

each discrete charge storage element within the first vertical stack has a first lateral spacing between the respective first inner sidewall and the respective first outer sidewall;

each discrete dielectric material portion within the second vertical stack has a second lateral spacing between the respective second inner sidewall and the respective second outer sidewall; and the first lateral spacing is less than the second lateral spacing.

7. The memory device of claim 1, wherein the at least one blocking dielectric layer has a respective laterally-undulating vertical cross-sectional profile in which first portions of the at least one blocking dielectric layer located at the levels of the insulating layers are laterally spaced from a vertical axis passing through a geometrical center of the memory opening by a greater lateral distance than second portions of the at least one blocking dielectric layer located at the levels of the electrically conductive layers.

8. The memory device of claim 7, wherein each discrete dielectric material portion within the second vertical stack comprises:

a respective annular top surface contacting a respective bottom surface segment of the at least one blocking dielectric layer;

a respective annular bottom surface contacting a respective top surface segment of the at least one blocking dielectric layer; and a respective cylindrical surface contacting a respective cylindrical surface segment of the at least one blocking dielectric layer.

9. The memory device of claim 7, wherein each discrete charge storage element with the first stack comprises:

a respective outer cylindrical sidewall contacting a respective cylindrical surface segment of the at least one blocking dielectric layer;

an annular top surface contacting a respective overlying one of the discrete dielectric material portions; and an annular bottom surface contacting a respective underlying one of the discrete dielectric material portions.

10. The memory device of claim 1, wherein the discrete charge storage elements comprise silicon nitride.

11. The memory device of claim 1, wherein the discrete charge storage elements comprise silicon nitride containing metal silicide particles embedded in the silicon nitride.

12. The memory device of claim 1, wherein the memory opening fill structure further comprises:

a material portion vertically extending through a horizontal plane including an interface between the alternating stack and the substrate and having a same material composition as the discrete charge storage elements; and a drain region contacting an upper end of the vertical semiconductor channel.

13. The memory device of claim 1, wherein each of the discrete dielectric material portions is in direct contact with a respective cylindrical surface segment of the tunneling dielectric layer.

14. The memory device of claim 1, wherein one of the discrete dielectric material portions is in direct contact with a bottommost surface of an overlying discrete charge storage element of the discrete charge storage elements, and is in direct contact with a topmost surface of an underlying discrete charge storage element of the discrete charge storage elements.

15. The memory device of claim 14, wherein said one of the discrete dielectric material portions is in direct contact with a bottom portion of an outer surface of the overlying discrete charge storage element, and is in direct contact with a top portion of an outer surface of the underlying discrete charge storage element.

16. The memory device of claim 1, wherein an entirety of an inner sidewall of one of the discrete dielectric material portions is in direct contact with an outer cylindrical surface segment of the tunneling dielectric layer.

17. The memory device of claim 1, wherein:

one of the discrete charge storage elements is located at a
level of one of the electrically conductive layers; and said one of the discrete charge storage elements has a
greater vertical extent than said one of the electrically
conductive layers.

18. The memory device of claim 17, wherein:

a top surface of said one of the discrete charge storage
elements is located above a first horizontal plane
including a top surface of said one of the electrically
conductive layers; and a bottom surface of said one of the discrete charge storage
elements is located below a second horizontal plane
including a bottom surface of said one of the electri-
cally conductive layers.

19. The memory device of claim 1, wherein:

one of the discrete dielectric material portions is located
at a level of one of the insulating layers; and said one of the discrete dielectric material portions has a
lesser vertical extent than said one of the insulating
layers.

20. The memory device of claim 17, wherein:

a top surface of said one of the discrete dielectric material
portions is located below a first horizontal plane includ-
ing a top surface of said one of the insulating layers;
and a bottom surface of said one of the discrete dielectric
material portions is located above a second horizontal
plane including a bottom surface of said one of the
insulating layers.

* * * * *